(12) United States Patent
Huang

(10) Patent No.: US 10,651,177 B1
(45) Date of Patent: May 12, 2020

(54) SEMICONDUCTOR DEVICE AND METHOD OF FORMING THE SAME

(71) Applicant: NANYA TECHNOLOGY CORPORATION, New Taipei (TW)

(72) Inventor: Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/183,374

(22) Filed: Nov. 7, 2018

(51) Int. Cl.
*H01L 27/108* (2006.01)
*H01L 23/528* (2006.01)
*H01L 21/768* (2006.01)
*H01L 23/535* (2006.01)

(52) U.S. Cl.
CPC .. *H01L 27/10888* (2013.01); *H01L 21/76804* (2013.01); *H01L 21/76834* (2013.01); *H01L 21/76895* (2013.01); *H01L 23/5283* (2013.01); *H01L 23/535* (2013.01)

(58) Field of Classification Search
CPC ......... H01L 27/10888; H01L 21/76804; H01L 21/76895; H01L 23/535; H01L 23/5283; G11C 5/06
See application file for complete search history.

(56) References Cited

U.S. PATENT DOCUMENTS

| | | | |
|---|---|---|---|
| 8,912,585 B2* | 12/2014 | Shin | H01L 21/76804 257/296 |
| 2013/0154101 A1* | 6/2013 | Park | H01L 27/10855 257/773 |
| 2017/0005099 A1* | 1/2017 | Lee | H01L 21/823481 |
| 2018/0190664 A1 | 7/2018 | Tsai et al. | |
| 2018/0190788 A1 | 7/2018 | Kwok et al. | |
| 2018/0190807 A1 | 7/2018 | Radosavljevic et al. | |
| 2019/0279988 A1* | 9/2019 | Lee | H01L 21/0332 |
| 2019/0304977 A1* | 10/2019 | Costa | H01L 27/0928 |

\* cited by examiner

*Primary Examiner* — Joseph C. Nicely
(74) *Attorney, Agent, or Firm* — Muncy, Geissler, Olds & Lowe, P.C.

(57) ABSTRACT

The present disclosure provides a semiconductor device. The semiconductor device includes a semiconductor substrate, a semiconductor layer, and a contact. The semiconductor layer is over the semiconductor substrate. The contact has an interface with the semiconductor layer. The contact is substantially tapered toward the semiconductor substrate to the interface.

19 Claims, 21 Drawing Sheets

SEMICONDUCTOR DEVICE AND METHOD OF FORMING THE SAME

TECHNICAL FIELD

The present disclosure relates to a semiconductor device and a method of forming the same, and more particularly, to a semiconductor device including a sidewall spacer.

DISCUSSION OF THE BACKGROUND

In recent years, the number and density of memory cells on a DRAM chip have dramatically increased. Areas of the DRAM chip on a substrate consist of an array of closely spaced memory cells with address and read/write circuits along the periphery of the DRAM chip. The individual DRAM cells (memory cells) are formed from a single access transistor, typically a field effect transistor (FET), and a storage capacitor with a node contact to one of the two source/drain areas of the FET. The capacitor is used for storing information in binary form (i.e., in values of 0 and 1) as an electrical charge, and the other of the two source/drain areas is connected to a bit line that is used to read and write information via peripheral circuits on the DRAM chip. Word lines that also form the FET gate electrodes over the active device (cell areas) are used to randomly access the individual memory cells.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor device. The semiconductor device includes a semiconductor substrate, a semiconductor layer, and a contact. The semiconductor layer is over the semiconductor substrate. The contact has an interface with the semiconductor layer. The contact is substantially tapered toward the semiconductor substrate to the interface.

In some embodiments, the semiconductor device further includes a first sidewall spacer and a second sidewall spacer. The second sidewall spacer is opposed to the first sidewall spacer. Both the semiconductor layer and the contact are between the first sidewall spacer and the second sidewall spacer.

In some embodiments, the semiconductor device further includes a first bit-line structure, a second bit-line structure, a first sidewall spacer and a second sidewall spacer. The first sidewall spacer is disposed on each sidewall of the first bit-line structure. The second sidewall spacer is disposed on each sidewall of the second bit-line structure. One of the first sidewall spacers is opposed to one of the second sidewall spacers. Both the semiconductor layer and the contact are between the one of the first sidewall spacers and the one of the second sidewall spacers.

In some embodiments, the semiconductor device further includes an active region in the semiconductor substrate. The contact is configured for routing the active region.

In some embodiments, the semiconductor layer includes an epitaxial layer.

In some embodiments, the semiconductor layer has an interface with the semiconductor substrate. The semiconductor layer is substantially tapered to the interface between the semiconductor layer and the semiconductor substrate.

In some embodiments, a thickness of the semiconductor layer ranges from about 1 nm to about 100 nm.

In some embodiments, the semiconductor device further includes a first structure and a second structure. The first structure includes a first bit-line structure and a first sidewall spacer. The first sidewall spacer is disposed on a sidewall of the first bit-line structure. The second structure includes a second bit-line structure and a second sidewall spacer. The second sidewall spacer is disposed on a sidewall of the second bit-line structure. Both the semiconductor layer and the contact are between the first structure and the second structure. A taper direction of the first structure is the same as that of the second structure, and opposed to the taper direction of the contact.

In some embodiments, the taper direction of the first structure is opposed to that of the semiconductor layer.

Another aspect of the present disclosure provides a semiconductor device. The semiconductor device includes a semiconductor substrate, a first sidewall spacer, a second sidewall spacer, a semiconductor layer and a contact. The second sidewall spacer is opposed to the first sidewall spacer. The semiconductor layer is over the semiconductor substrate. The semiconductor layer includes an upper portion and a lower portion, both of which are disposed between the first sidewall spacer and the second sidewall spacer. The upper portion is disposed on the lower portion, wherein the upper portion is, in a direction in which the first sidewall spacer and the second sidewall spacer are arranged, longer than the lower portion.

In some embodiments, the first sidewall spacer includes a first sidewall layer and a second sidewall layer. The first sidewall layer is disposed on the semiconductor substrate. The second sidewall layer is disposed on the semiconductor layer.

In some embodiments, the second sidewall layer is in contact with the first sidewall layer.

In some embodiments, the semiconductor layer is in contact with the first sidewall layer.

In some embodiments, the first sidewall spacer includes a nitride-oxide-nitride (N—O—N) structure.

In some embodiments, the semiconductor device further includes a first structure. The first structure includes a first bit-line structure and the first sidewall spacer. The first sidewall spacer is disposed on a sidewall of the first bit-line structure and in contact with the semiconductor layer and the contact. A taper direction of the first structure is opposed to that of the contact.

Another aspect of the present disclosure provides a method of forming a semiconductor device. The method includes forming a first multi-layer spacer on a semiconductor substrate; forming a semiconductor layer on the semiconductor substrate during the formation of the first multi-layer spacer; and forming a contact on the semiconductor layer.

In some embodiments, the formation of the first multi-layer spacer on the semiconductor substrate includes: forming a first sidewall layer of the first multi-layer spacer on the semiconductor substrate; and forming a second sidewall layer of the first multi-layer spacer on the semiconductor layer after the formation of the semiconductor layer.

In some embodiments, the formation of the semiconductor layer on the semiconductor substrate during the formation of the first multi-layer spacer includes: forming the semiconductor layer in contact with the first sidewall layer on the semiconductor substrate.

In some embodiments, the method further includes: forming a first bit-line structure and a second bit-line structure on the semiconductor substrate. The formation of the first multi-layer spacer includes: forming a first sidewall layer of the first multi-layer spacer on each sidewall of the first bit-line structure. The method further includes: forming a first sidewall layer of a second multi-layer spacer on each sidewall of the second bit-line structure. The formation of the semiconductor layer includes: forming the semiconductor layer, in contact with the first sidewall layer of the first multi-layer spacer and the first sidewall layer of the second multi-layer spacer, on the semiconductor substrate. The method further includes forming a second sidewall layer of the first multi-layer spacer on each first sidewall layer of the first multi-layer spacer, and on the semiconductor layer; and forming a second sidewall layer of the second multi-layer spacer on each first sidewall layer of the second multi-layer spacer, and on the semiconductor layer. The formation of the contact includes: forming the contact on the semiconductor layer.

In some embodiments, the formation of the first bit-line structure includes: forming the first bit-line structure, which is substantially tapered toward a direction opposite to the semiconductor substrate.

In some related approaches of forming a semiconductor device, for a given height of the first bit-line structure, a height of the contact is relatively high. Accordingly, a contact area between the contact and the semiconductor substrate is relatively small, resulting in a relatively high contact resistance between the contact and the semiconductor substrate. As a result, performance of a DRAM, such as a retention ability of a memory cell of the DRAM, is relatively low.

In the present disclosure, for a given height of the first bit-line structure, because the semiconductor layer serves as a raising feature, a height of the contact is relatively short. Accordingly, a contact area between the contact and the semiconductor layer is relatively large, resulting in a relatively low contact resistance between the contact and the semiconductor layer. As a result, performance of a DRAM, such as a retention ability of a memory cell of the DRAM, is relatively high.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
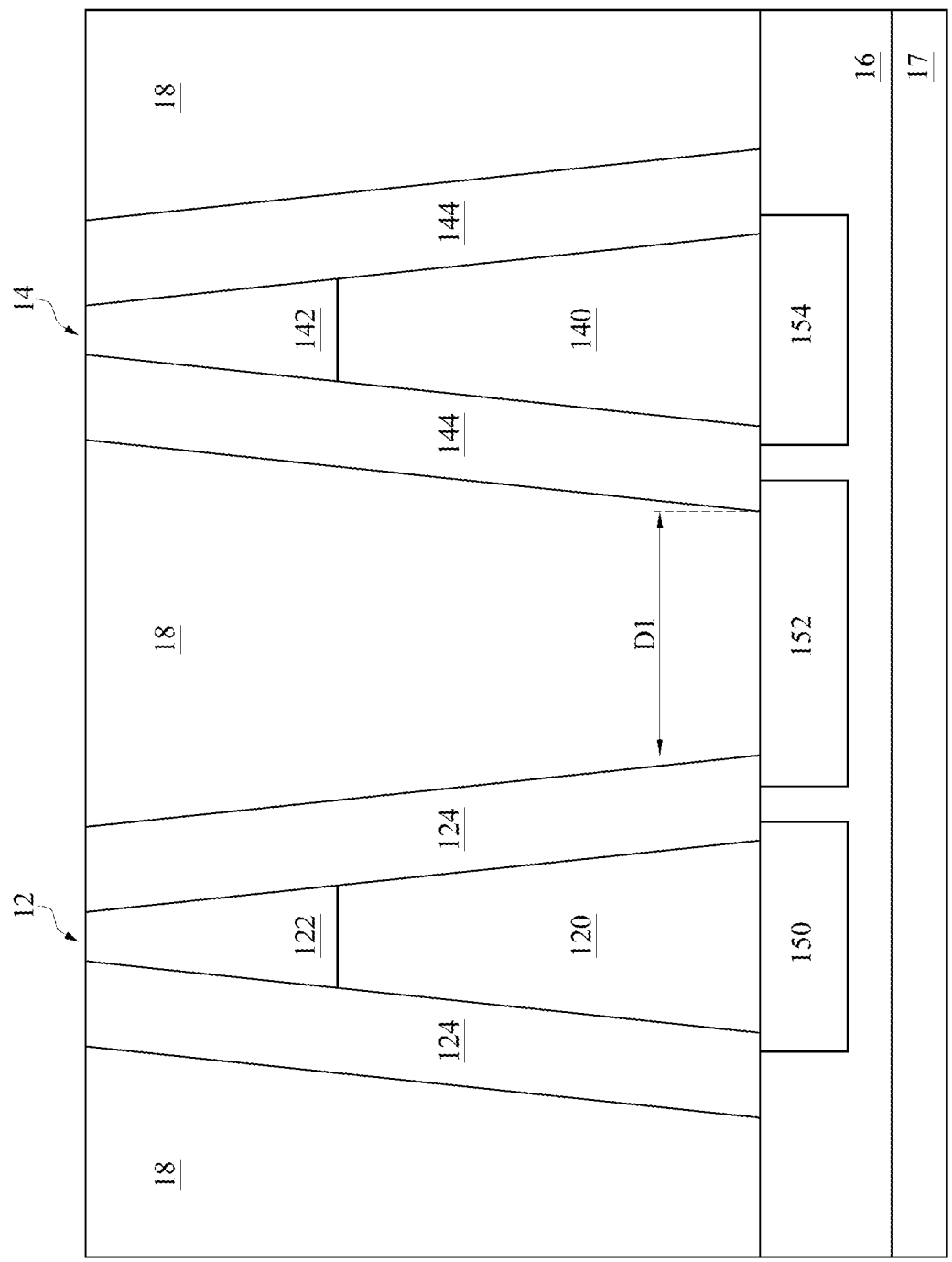
FIG. 1 is a cross-sectional view of a comparative semiconductor device.

Embodiments of the disclosure are discussed in detail below. It should be appreciated that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearances of the phrases "in some embodiments" or "in an embodiment" in various places throughout this specification do not necessarily refer to the same embodiment. Furthermore, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific terms) used herein have the same meaning as commonly understood by a person having ordinary skill in the art to which the embodiments of the present disclosure belong. It should be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

FIG. 1 is a cross-sectional view of a comparative semiconductor device 10. Referring to FIG. 1, the semiconductor device 10 includes a first sidewall spacer 124, a second sidewall spacer 144, and a contact 18.

The first sidewall spacer 124, disposed on (or interfaced with) each sidewall of a first bit-line structure 12 disposed on a semiconductor substrate 17, functions to electrically isolate the first bit-line structure 12 from other components. In some embodiments, the first sidewall spacer 124 includes silicon nitride, silicon oxide, silicon oxynitride, or any other suitable dielectric material. The first sidewall spacers 124 and the first bit-line structure 12 in combination define a first structure. The first structure is substantially tapered to a surface opposite to an interface between the first structure and the semiconductor substrate 17.

In some embodiments, the substrate 17 includes a semiconductor substrate material such as a silicon substrate. In some embodiments, the substrate 17 includes silicon germanium, gallium arsenic, or other suitable semiconductor materials. In some embodiments, the substrate 17 further includes doped regions such as a P-well and/or an N-well (not shown). In some other embodiments, the substrate 17 further includes other features such as a buried layer. Furthermore, in some embodiments, the substrate 17 is a semiconductor on insulator such as silicon on insulator (SOI). In other embodiments, the semiconductor substrate 17 includes a gradient semiconductor layer, and/or further includes a semiconductor layer overlying another semiconductor layer of a different type such as a silicon layer on a silicon germanium layer. In some other examples, a compound semiconductor substrate includes a multilayer silicon structure or a silicon substrate may include a multilayer compound semiconductor structure. In some embodiments, the substrate 17 may include other elementary semiconductors such as germanium and diamond. In some embodiments, the substrate 17 includes a compound semiconductor such as silicon carbide, gallium arsenide, indium arsenide, or indium phosphide.

The second sidewall spacer 144, disposed on (or interfaced with) each sidewall of a second bit-line structure 14 disposed on the semiconductor substrate 17, functions to electrically isolate the second bit-line structure 14 from other components. One of the second sidewall spacers 144 is opposed to one of the first sidewall spacers 124. Moreover, the second sidewall spacers 144 and the second bit-line structure 14 in combination define a second structure. A taper direction of the second structure is the same as that of the first structure. In further detail, the second structure is also substantially tapered to a surface opposite to an interface between the second structure and the semiconductor substrate 17. In some embodiments, the second sidewall spacer 144 includes silicon nitride, silicon oxide, silicon oxynitride, or any other suitable dielectric material.

The contact 18, disposed on the semiconductor substrate 17, functions to route an active region 152 in the semiconductor substrate 17. The active region 152 is electrically isolated from other active regions 150 and 154 by an insulation layer 16 in the substrate 17, or by any other means, such as a buried word line architecture, wherein for all the active regions 150, 152 and 154, a source region or a drain region of a transistor is to be defined therein. In addition, the contact 18 is defined by and between the one of the second sidewall spacers 144 and the one of the first sidewall spacers 124 during a process of manufacturing the semiconductor device 10. Accordingly, the shape of the contact 18 is determined by the first sidewall spacer 124 and the second sidewall spacer 144, and in particular, by a taper direction of both the first sidewall spacer 124 and the second sidewall spacer 144. Taking the first sidewall spacer 124 for instance, a taper direction of the contact 18 is opposite to that of the first sidewall spacer 124. In further detail, the contact 18 is substantially tapered toward the semiconductor substrate 17 to an interface between the contact 18 and the semiconductor substrate 17.

The first bit-line structure 12 includes a bit-line conductor 120, and a hard mask 122 disposed on the bit-line conductor 120.

The bit-line conductor 120 functions to transmit a signal on a bit-line of a dynamic random access memory (DRAM) to the active region 150, in which a source region or a drain region of a transistor is to be defined, in the substrate 17. In some embodiments, the bit-line conductor 120 includes polysilicon, tungsten, tungsten nitride, copper, aluminum, tungsten, or any other suitable conductive material.

The hard mask 122 functions to isolate the bit-line conductor 120. In some embodiments, the hard mask 122 includes silicon nitride, silicon oxynitride, silicon carbide, and/or other suitable dielectric materials.

The second bit-line structure 14 includes a bit-line conductor 140, and a hard mask 142 disposed on the bit-line conductor 140.

The bit-line conductor 140 functions to transmit a signal on a bit line of a dynamic random access memory (DRAM) to the active region 154, in which a source or drain of a transistor is to be defined, in the substrate 17. The bit-line conductor 140 and the bit-line conductor 120 are in the same semiconductor layer. In some embodiments, the bit-line conductor 140 includes polysilicon, tungsten, tungsten nitride, copper, aluminum, tungsten, or any other suitable conductive material.

The hard mask 142 functions to isolate the bit-line conductor 140. The hard mask 142 and the hard mask 122 are in the same semiconductor layer. In some embodiments, the hard mask 142 includes silicon nitride, silicon oxynitride, silicon carbide, and/or other suitable dielectric materials.

Taking the first bit-line structure 12 for instance, for a given height of the first bit-line structure 12, a height of the contact 18 is relatively high. A contact area between the contact 18 and the semiconductor substrate 17 is negatively correlated to the height of the contact 18 to represent the contact resistance. Accordingly, a contact area, which is represented by a distance D1 in a circumstance in which length of the contact 18 is given, between the contact 18 and the semiconductor substrate 17, is relatively small, resulting in a relatively high contact resistance between the contact 18 and the semiconductor substrate 17. As a result, performance of a DRAM, such as a read or a write ability of a memory cell of the DRAM, is relatively poor.

Figure 2:
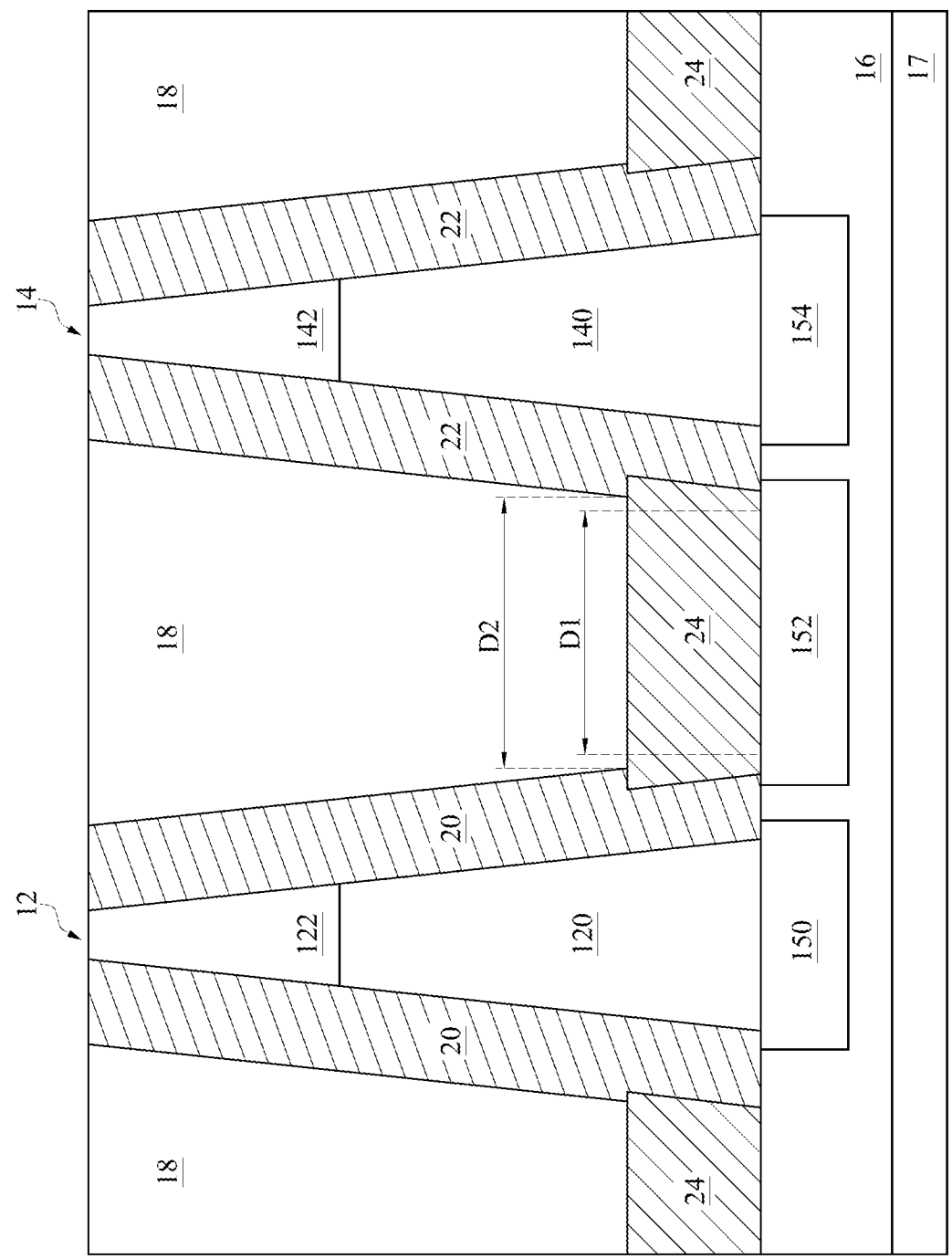
FIG. 2 is a cross-sectional view of a semiconductor device, in accordance with some embodiments of the present disclosure.

FIG. 2 is a cross-sectional view of a semiconductor device 20, in accordance with some embodiments of the present disclosure. Referring to FIG. 2, the semiconductor device 20 is similar to the semiconductor device 10 described and illustrated with reference to FIG. 1 except that, for example, the semiconductor device 20 includes a first sidewall spacer 20, a second sidewall spacer 22 and a semiconductor layer 24.

The first sidewall spacer 20 includes a multi-layer structure, and therefore can be called a first multi-layer spacer in the following descriptions.

The second sidewall spacer 22 includes a multi-layer structure, and therefore can be called a second multi-layer spacer in the following descriptions.

Both the semiconductor layer 24 and the contact 18 are between the first sidewall spacer 20 and the second sidewall spacer 22.

The semiconductor layer 24, disposed over the semiconductor substrate 17, serves as a raising feature to raise the contact 18 disposed on the semiconductor layer 24. The contact 18 has an interface with the semiconductor layer 24, and is substantially tapered toward the semiconductor substrate 17 to the interface. In some embodiments, the semiconductor layer 24 is in contact with the semiconductor substrate 17. In other embodiments, there are some other layers between the semiconductor layer 24 and the semiconductor substrate 17. In some embodiments, the semiconductor layer 24 includes an epitaxial layer.

The semiconductor layer 24 is formed during formation of the first sidewall spacer 20 and the second sidewall spacer 22, as will be described in detail with reference to FIGS. 3 to 10. Taking the first sidewall spacer 20 for instance, a portion of the first sidewall spacer 20 is disposed on the semiconductor layer 24 and the other portion of the first sidewall spacer 20 is disposed on the semiconductor substrate 17. Similarly, a relationship in structure between the second sidewall spacer 22 and the semiconductor layer 24 is same as that between the first sidewall spacer 20 and the semiconductor layer 24.

In addition, the semiconductor layer 24 is defined by and between one of the first sidewall spacers 20 and one of the second sidewall spacers 22 during a process of manufacturing the semiconductor device 20, as will be described in detail with reference to FIGS. 3 to 10, wherein the one of the first sidewall spacers is opposed to the one of the second sidewall spacers. Accordingly, the taper direction of the semiconductor layer 24 is opposite to, for example, that of the first sidewall spacers 20. The semiconductor layer 24 is substantially tapered to an interface between the semiconductor layer 24 and the semiconductor substrate 17. In further detail, the semiconductor layer 24 includes an upper portion and a lower portion, both of which are disposed between the first sidewall spacer 20 and the second sidewall spacer 22. The upper portion is disposed on the lower portion. The upper portion is, in a direction in which the first sidewall spacer 20 and the second sidewall spacer 22 are arranged, longer than the lower portion.

Taking the first bit-line structure 12 for instance, for a given height of the first bit-line structure 12, because the semiconductor layer 24 serves as a raising feature, a height of the contact 18 is relatively short. For reasons similar to those described in the embodiment of FIG. 1, a contact area between the contact 18 and the semiconductor layer 24 is negatively correlated to the height of the contact 18 to represent the contact resistance. That is, a contact area between the contact 18 and the semiconductor layer 24 is positively correlated to a thickness of the semiconductor layer 24. Due to a structure of the semiconductor layer 24, the contact area, which is represented by a distance D2 in a circumstance in which length of the contact 18 is given, between the contact 18 and the semiconductor layer 17 is relatively large, resulting in relatively low contact resistance between the contact 18 and the semiconductor layer 17. As a result, performance of a DRAM, such as a read or a write ability of a memory cell of the DRAM, is relatively high.

In some embodiments, a thickness of the semiconductor layer 24 ranges from about 1 nm to about 100 nm.

Figure 8:
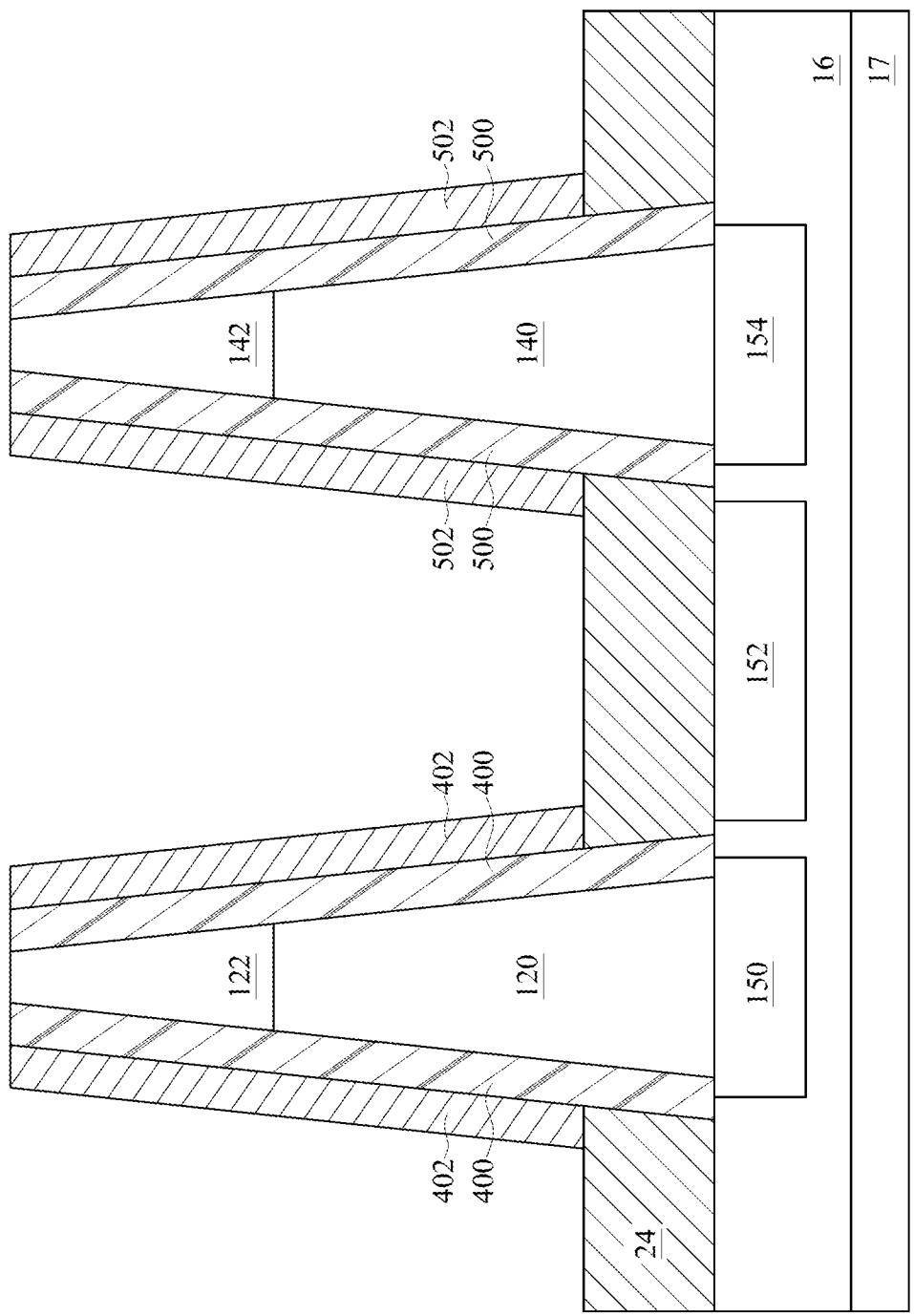
Figure 9:
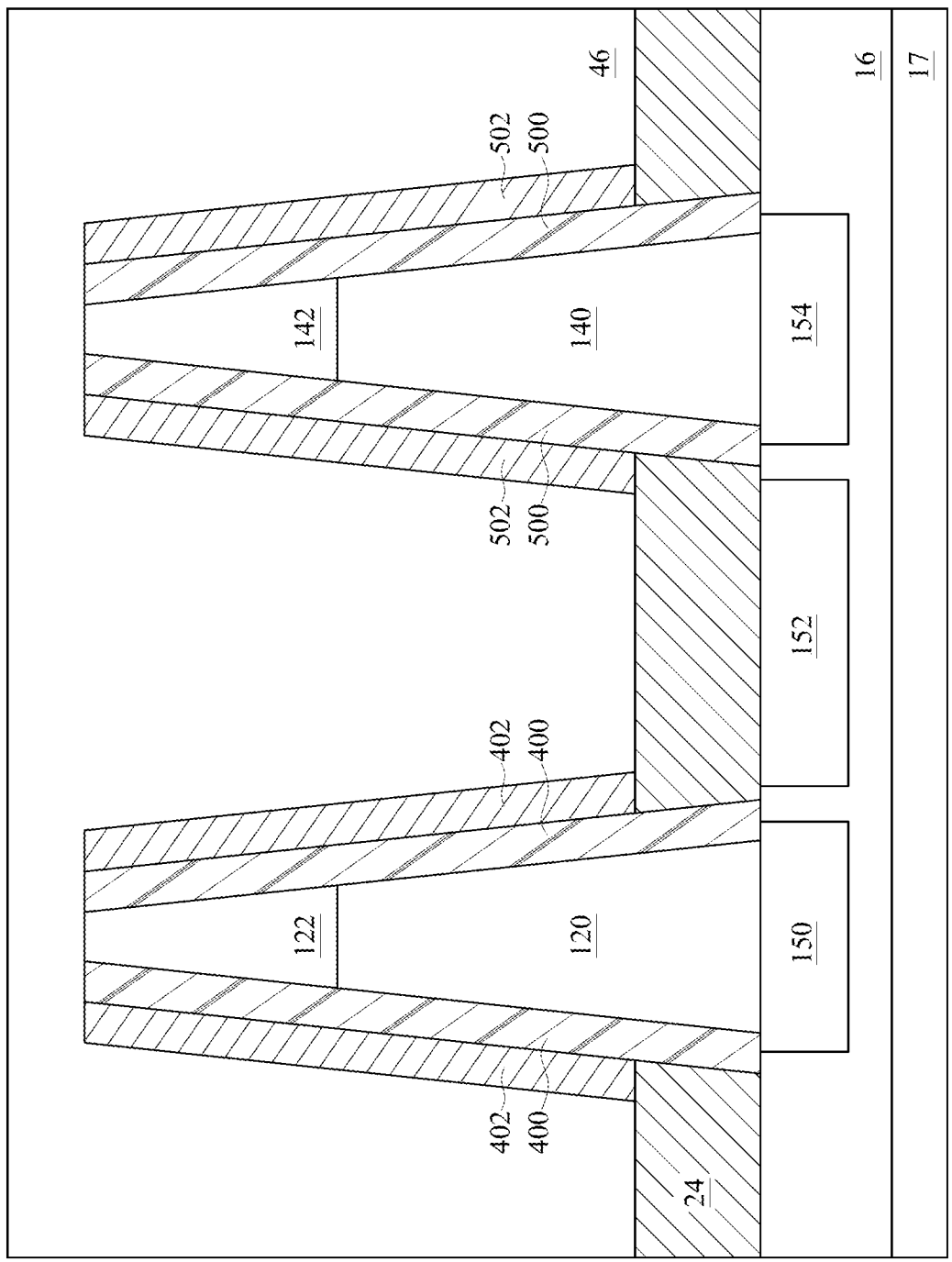
Figure 10:
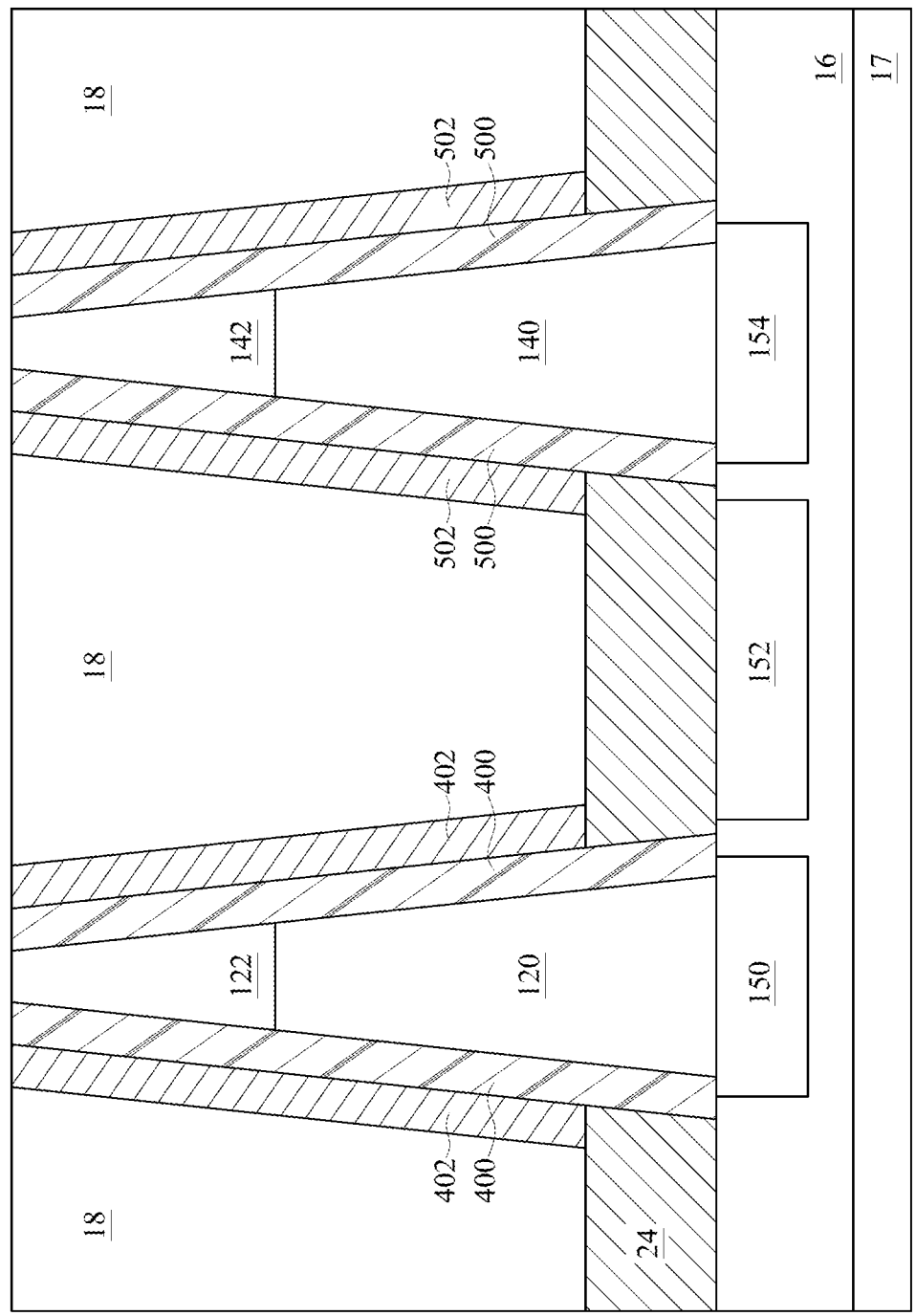

FIGS. 3 to 10 individually show a semiconductor structure corresponding to one operation stage of forming a semiconductor device 30 (as shown in FIG. 10), in accordance with some embodiments of the present disclosure. It should be understood that FIG. 3 to FIG. 10 have been simplified to facilitate a clear understanding of various embodiments of the present disclosure.

Figure 3:
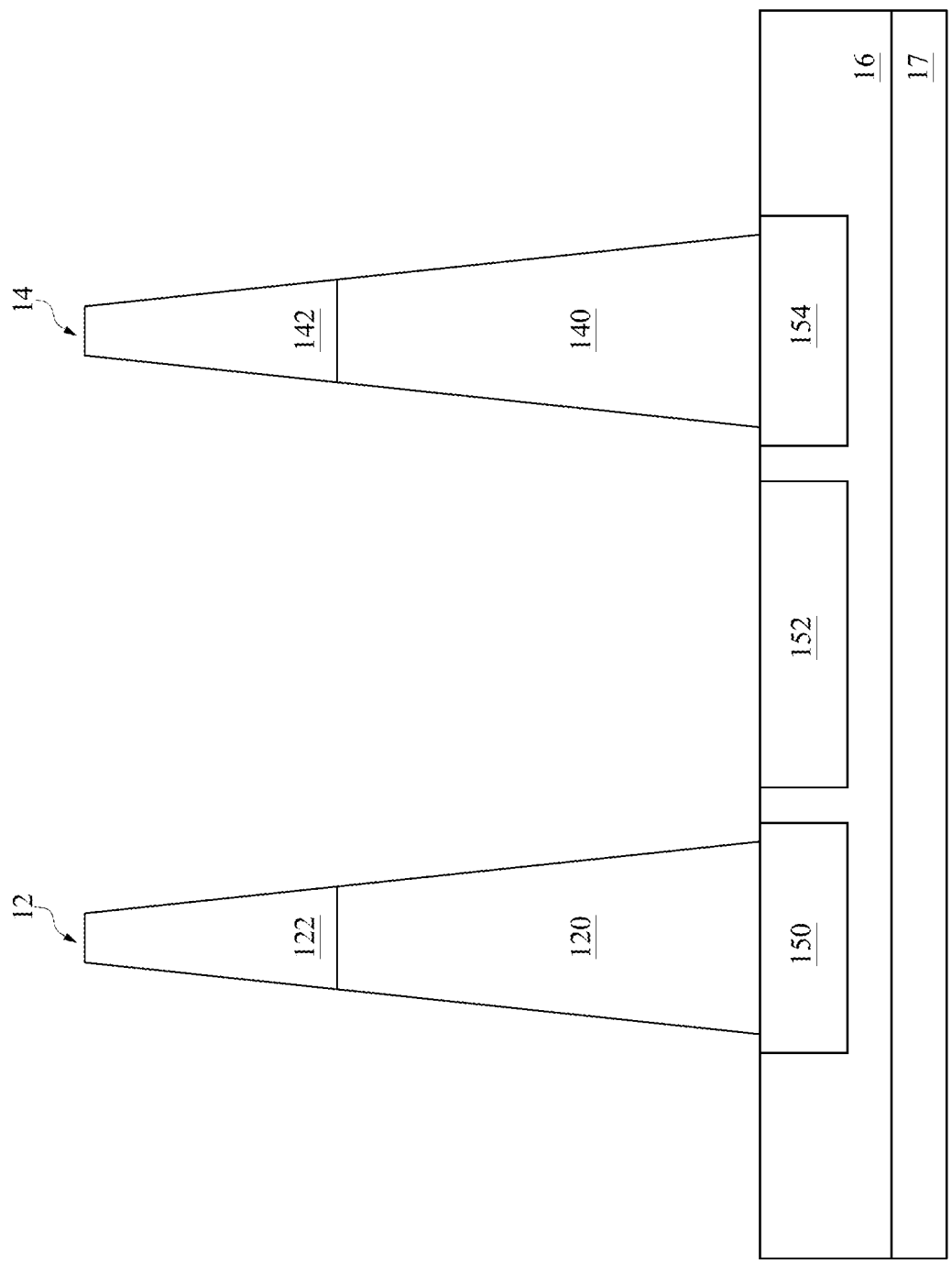
FIGS. 3 to 10 individually show a semiconductor structure corresponding to one operation stage of forming a semiconductor device, in accordance with some embodiments of the present disclosure.

Referring to FIG. 3, a semiconductor substrate 17 is received. In some embodiments, the semiconductor substrate 17 includes silicon germanium, gallium arsenic, or other suitable semiconductor materials. In some embodiments, the semiconductor substrate 17 further includes doped regions such as a P-well and/or an N-well (not shown). In some other embodiments, the semiconductor substrate 17 further includes other features such as a buried layer. Furthermore, in some embodiments, the semiconductor substrate 17 is a semiconductor on insulator such as silicon on insulator (SOI). In other embodiments, the semiconductor substrate 17 includes a gradient semiconductor layer, and/or further includes a semiconductor layer overlying another semiconductor layer of a different type such as a silicon layer on a silicon germanium layer. In some other examples, a compound semiconductor substrate includes a multilayer silicon structure, or a silicon substrate may include a multilayer compound semiconductor structure. In some embodiments, the semiconductor substrate 17 may include other elementary semiconductors such as germanium and diamond. In some embodiments, the semiconductor substrate 17 includes a compound semiconductor such as silicon carbide, gallium arsenide, indium arsenide, or indium phosphide.

Active regions 150, 152 and 154 are defined in the semiconductor substrate 17 by, for example, an ion implantation process or an ion diffusion process. A source region or a drain region of a transistor (not shown) is to be defined in each of the active regions 150, 152 and 154.

An insulation layer 16 is formed in the substrate 17 so as to electrically isolate the active regions 150, 152 and 154 from one another.

The semiconductor structure shown in FIG. 3, in some embodiments, further includes an isolation structure such as a shallow trench isolation (STI) feature (not shown) formed in the semiconductor substrate 17 for isolating the active regions 150, 152 and 154. In some embodiments, the isolation structure includes a local oxidation of silicon (LOCOS) configuration. The isolation structure includes silicon oxide, silicon nitride, silicon oxynitride, fluoride-doped silicate (FSG), and/or a low k dielectric material known in the art. In some embodiments, the active regions 150, 152 and 154 include the source region or the drain region of n-type metal-oxide-semiconductor field effect transistors (e.g., NMOSFET or NFET) and p-type metal-oxide-semiconductor field effect transistors (e.g., PMOSFET or PFET).

Bit-line conductors 120 and 140 with hard masks 122 and 142 on the top of the bit-line conductors 120 and 140 are formed on the semiconductor substrate 17 by, for example, chemical vapor deposition (CVD) or physical vapor deposition (PVD or sputtering). In some embodiments, the hard masks 122 and 142 include silicon nitride, silicon oxynitride, silicon carbide, and/or other suitable dielectric materials.

The bit line conductor 120 and the hard mask 122 in combination form a first bit-line structure 12. Similarly, the bit line conductor 140 and the hard mask 142 in combination form a second bit-line structure 14. The first bit-line structure and the second bit-line structure are substantially tapered toward a direction opposite to the semiconductor substrate 17.

Figure 4:
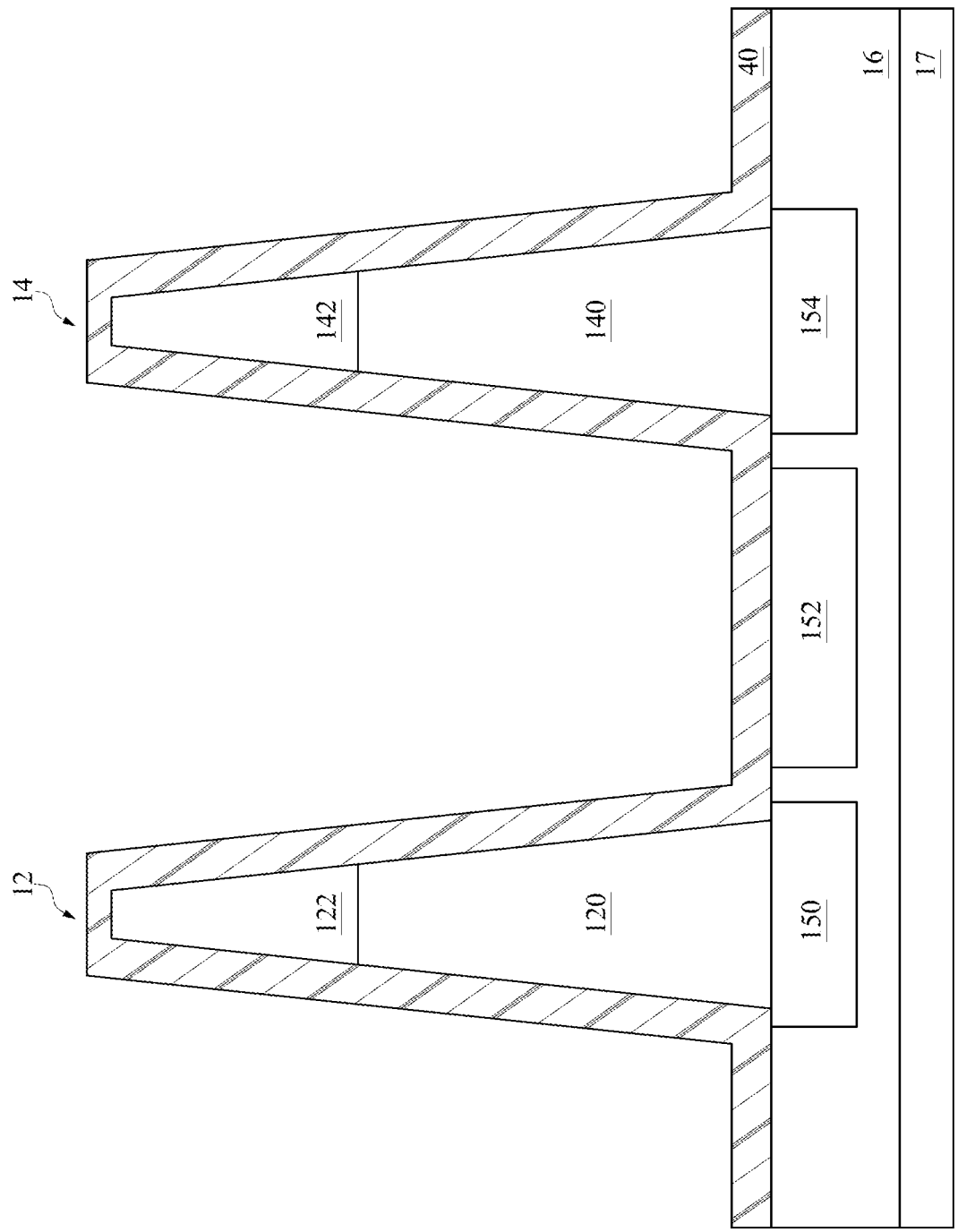

Referring to FIG. 4, a dielectric layer 40 is formed on the semiconductor substrate 17, the first bit-line structure 12 and the second bit-line structure 14 by, for example, thermal or chemical vapor deposition in a blanket manner. In an embodiment, the dielectric layer 40 includes silicon nitride. In some embodiments, the dielectric layer 40 includes $Si_3N_4$, SiON, SiOCN, SiCN, $SiO_2$, or combinations thereof.

It should be noted that before formation of the dielectric layer 40, the semiconductor structure undergoes additional CMOS processing to form various features of the NFET and PFET devices, as is known in the art. Thus, various features are only briefly discussed herein. In some embodiments, the various features include lightly doped source/drain regions (n-type and p-type LDD), source/drain (S/D) regions, or contact etch stop layers (CESL).

Figure 5:
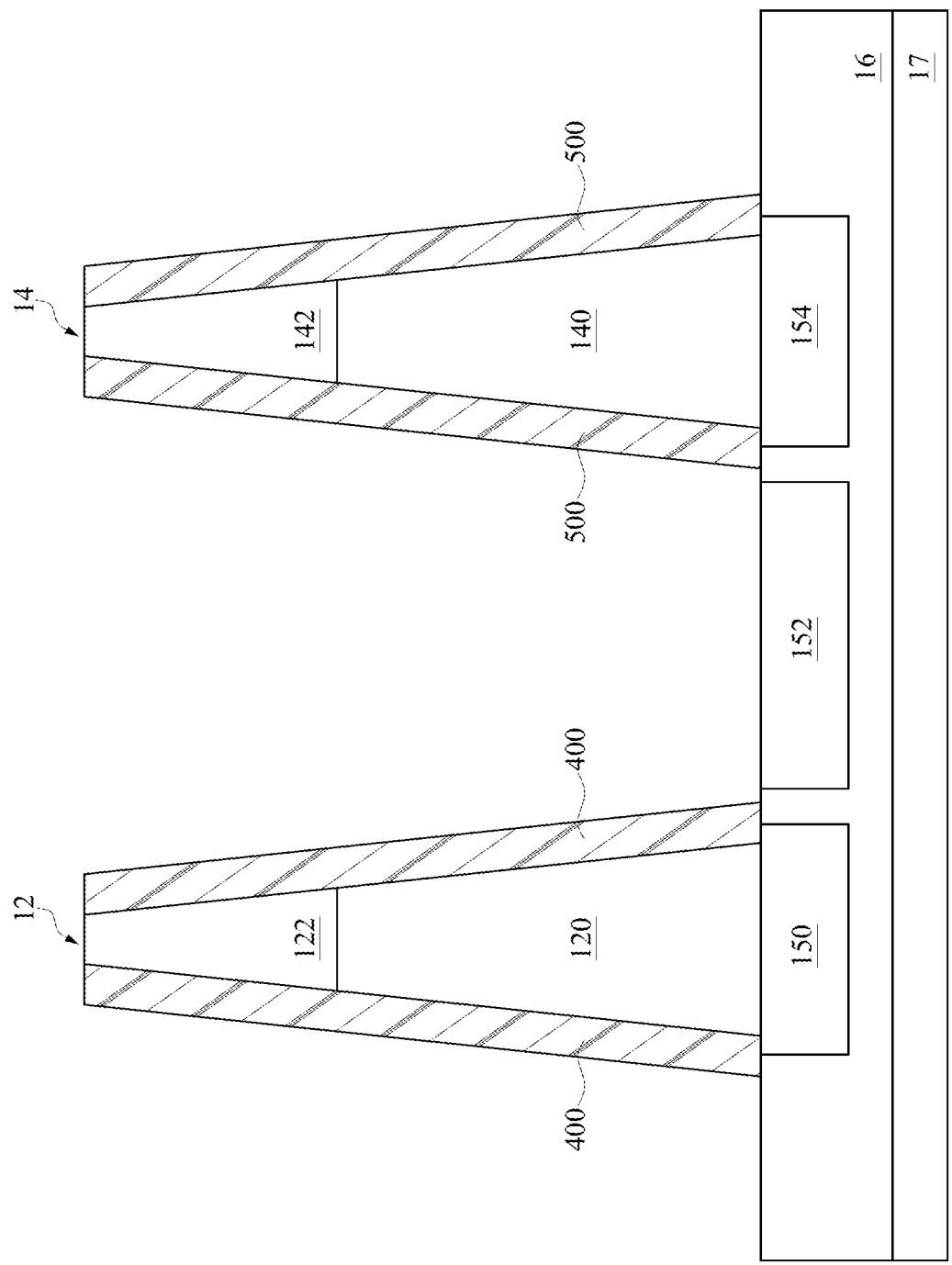

Referring to FIG. 5, a sidewall layer 400 is formed on each sidewall of the first bit-line structure 12, and a sidewall layer 500 is formed on each sidewall of the second bit-line structure 14 by performing, for example, an anisotropic etching process, or other suitable etching process, on the dielectric layer 40 shown in FIG. 4.

Figure 6:
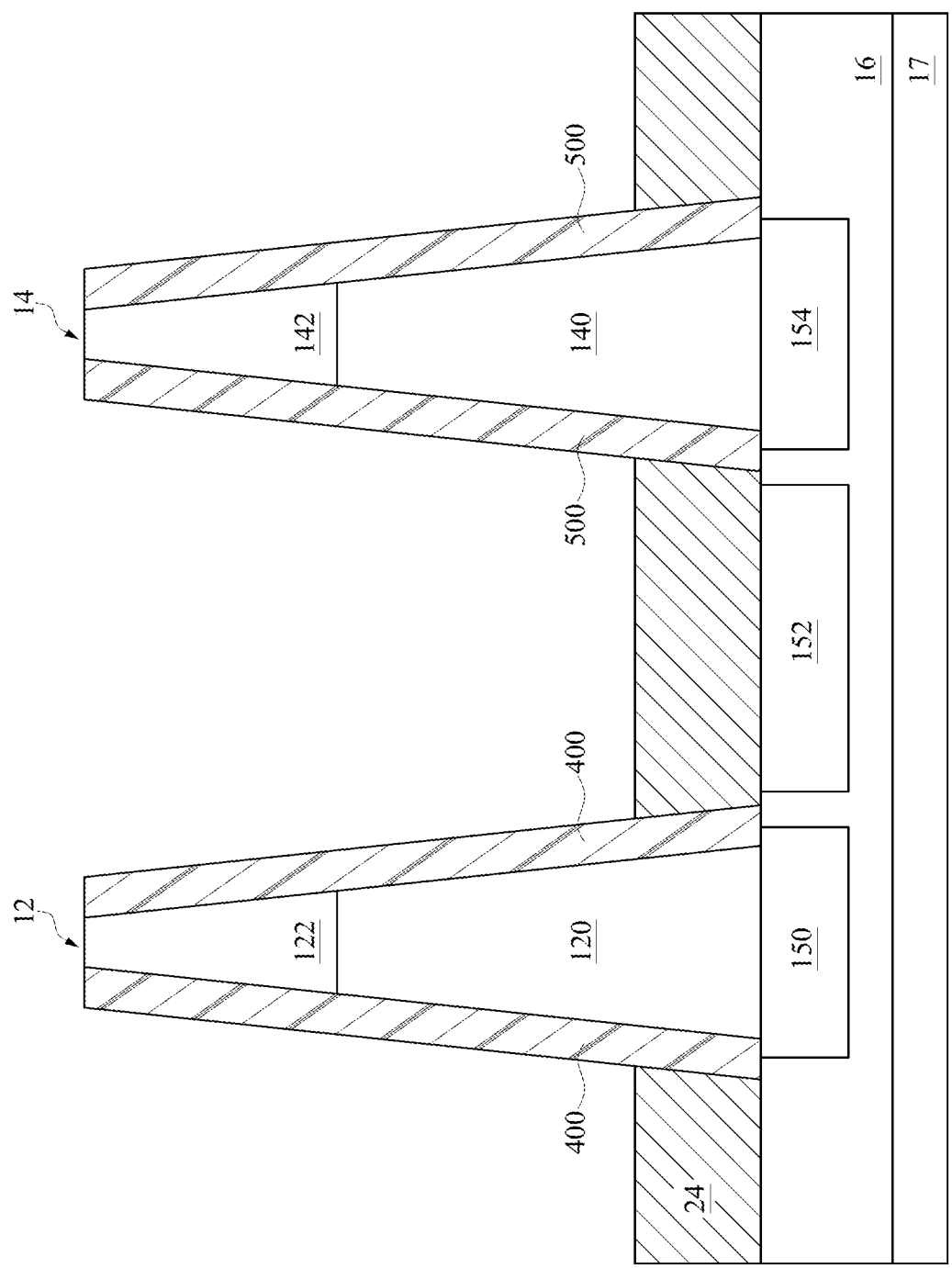

Referring to FIG. 6, a semiconductor layer 24 is formed on the semiconductor substrate 17, and between the sidewall layers 400 and 500 by, for example, an epitaxial deposition process. In such embodiments, the semiconductor layer 24 includes an epitaxial layer. The semiconductor layer 24 is in contact with the sidewall layers 400 and 500. The semiconductor layer 24 has the same impurity, for example, silicon, as the active region 152. Therefore, a silicon surface is accordingly raised.

Figure 7:
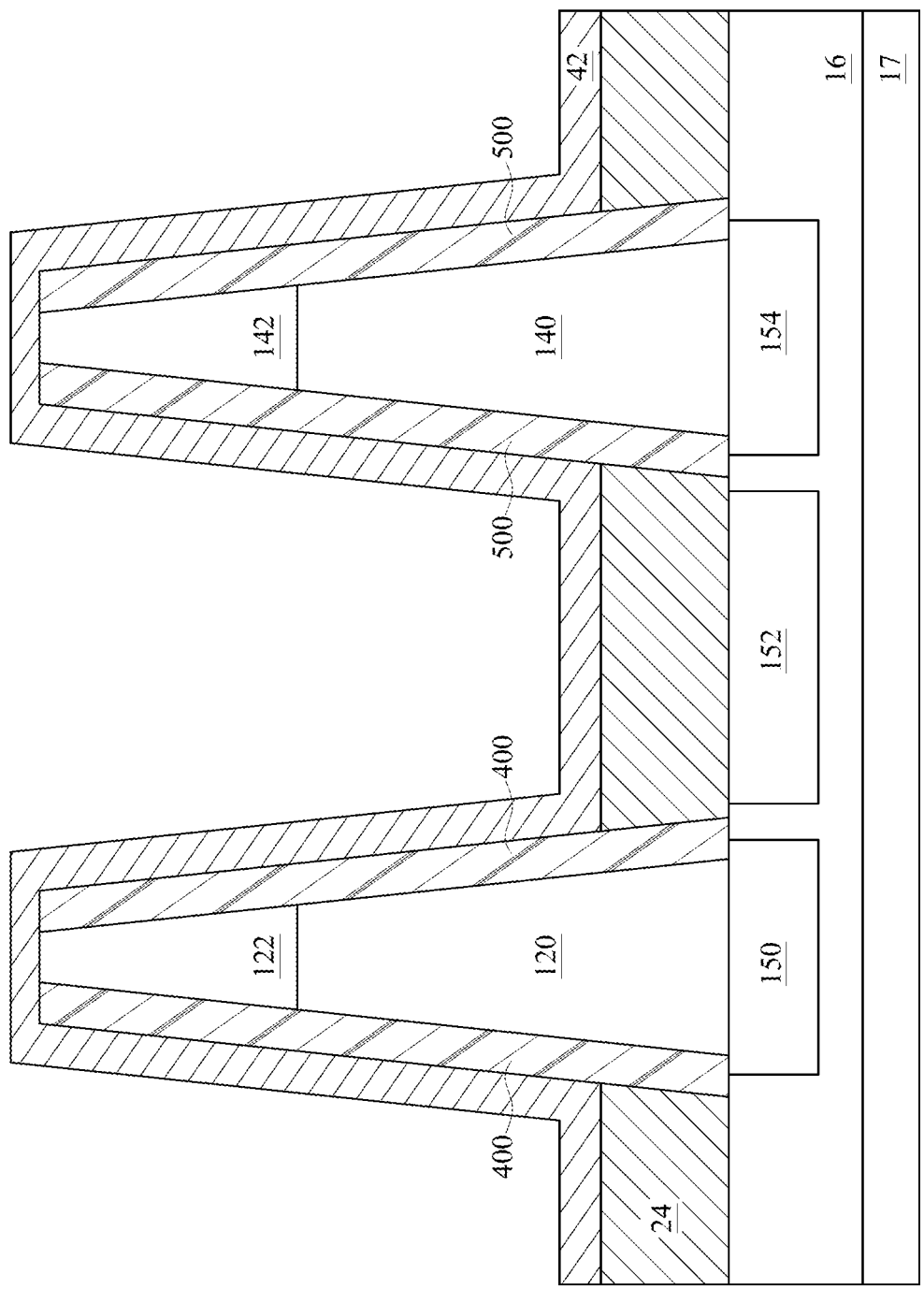

Referring to FIG. 7, a dielectric layer 42 is formed on the semiconductor layer 24 and the sidewall layers 400 and 500 by, for example, thermal or chemical vapor deposition in a blanket manner. In an embodiment, the dielectric layer 42 includes silicon nitride. In some embodiments, the dielectric layer 40 includes $Si_3N_4$, SiON, SiOCN, SiCN, $SiO_2$, or combinations thereof.

Referring to FIG. 8, sidewall layers 402 and 502, exposing a portion of the semiconductor layer 24, are formed on a portion of the sidewall layer 400, a portion of the sidewall layer 500 and another portion of the semiconductor layer 24 by performing, for example, an isotropic etching process or other suitable etching process, on the dielectric layer 42. The sidewall layers 400 and 402 in combination form a first sidewall spacer. Similarly, the sidewall layers 500 and 502 in combination form a second sidewall spacer. In summary, the semiconductor layer 24 is formed on the semiconductor substrate 17 during the formation of the first multi-layer spacer and the formation of the second multi-layer spacer. The sidewall layers 402 and 502 are formed on the semiconductor layer 24 after the formation of the semiconductor layer 24.

Referring to FIG. 9, a conductive material 46 is formed on the semiconductor layer 24 and on the sidewall layers 400, 402, 500 and 502 by, for example, thermal or chemical vapor deposition in a blanket manner. In some embodiments, the conductive material 46 includes polysilicon.

Referring to FIG. 10, a contact 18 configured for routing the active region 152 is formed on the semiconductor layer 24 and the sidewall layers 402 and 502 by performing, for example, an isotropic etching back process, CMP process, or other suitable etching process, on the conductive material 46.

In the present disclosure, the semiconductor layer 24 is formed to raise a silicon surface, thereby increasing a contact area between the contact 18 and the silicon surface. As a result, a contact resistance between the contact 18 and the silicon surface is relatively low, and therefore performance of the semiconductor device 30 is relatively high.

FIGS. 11 to 14 individually show a semiconductor structure corresponding to one operation stage of forming a semiconductor device 60, in accordance with some embodiments of the present disclosure. It should be understood that FIG. 11 to FIG. 14 have been simplified to better facilitate a clear understanding of various embodiments of the present disclosure.

Embodiments shown in FIGS. 11 to 14 follow the embodiment shown in FIG. 8, in particular, the sidewall layers 400 and 500 include a silicon nitride, and the sidewall layers 402 and 502 include an oxide.

Figure 11:
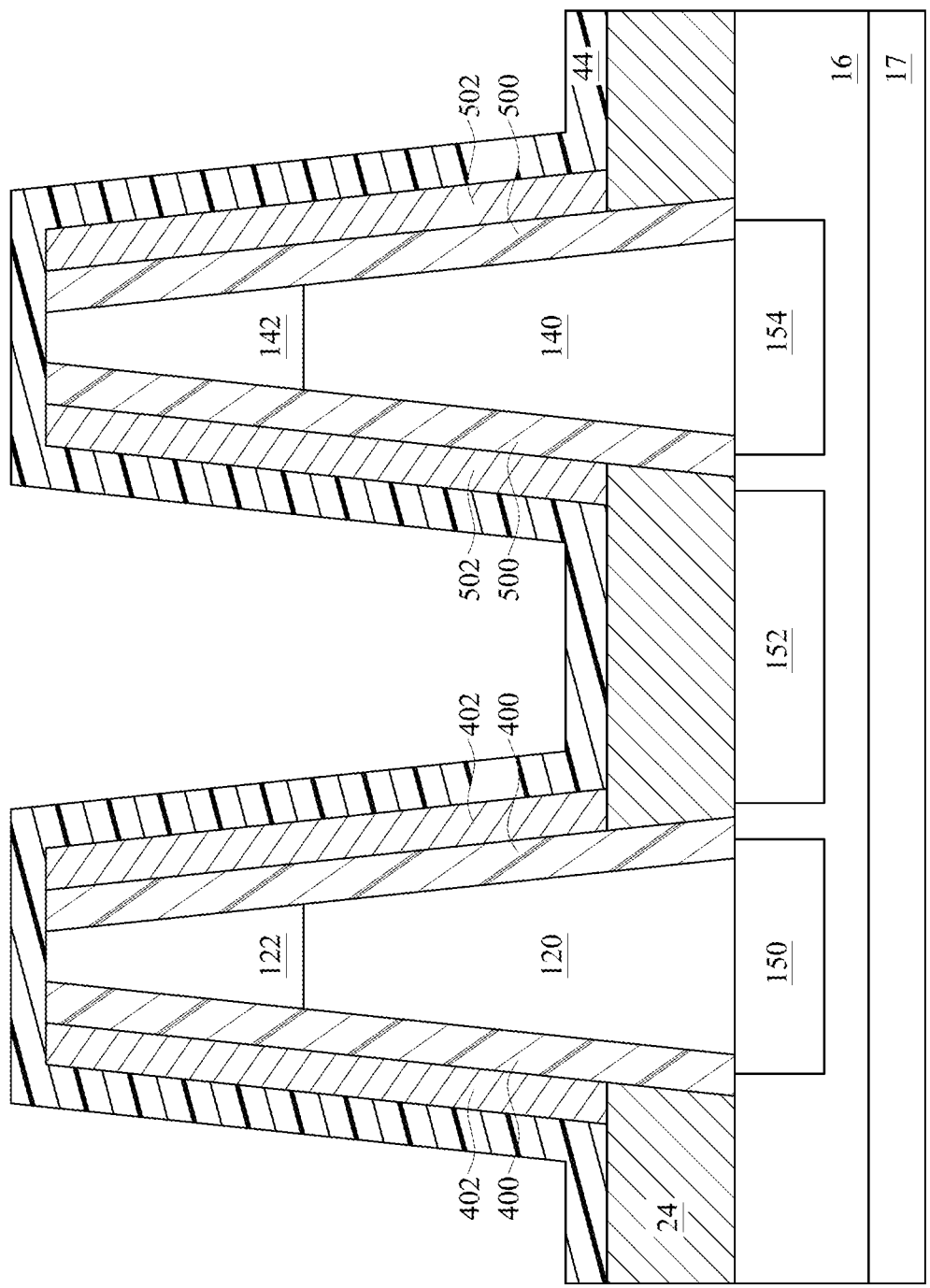
FIGS. 11 to 14 individually show a semiconductor structure corresponding to one operation stage of forming a semiconductor device, in accordance with some embodiments of the present disclosure.

Referring to FIG. 11, a dielectric layer 44 is formed on the semiconductor layer 24 and on the sidewall layers 400, 500, 402 and 502, by, for example, thermal or chemical vapor deposition in a blanket manner. In an embodiment, the dielectric layer 44 includes silicon nitride.

Figure 12:
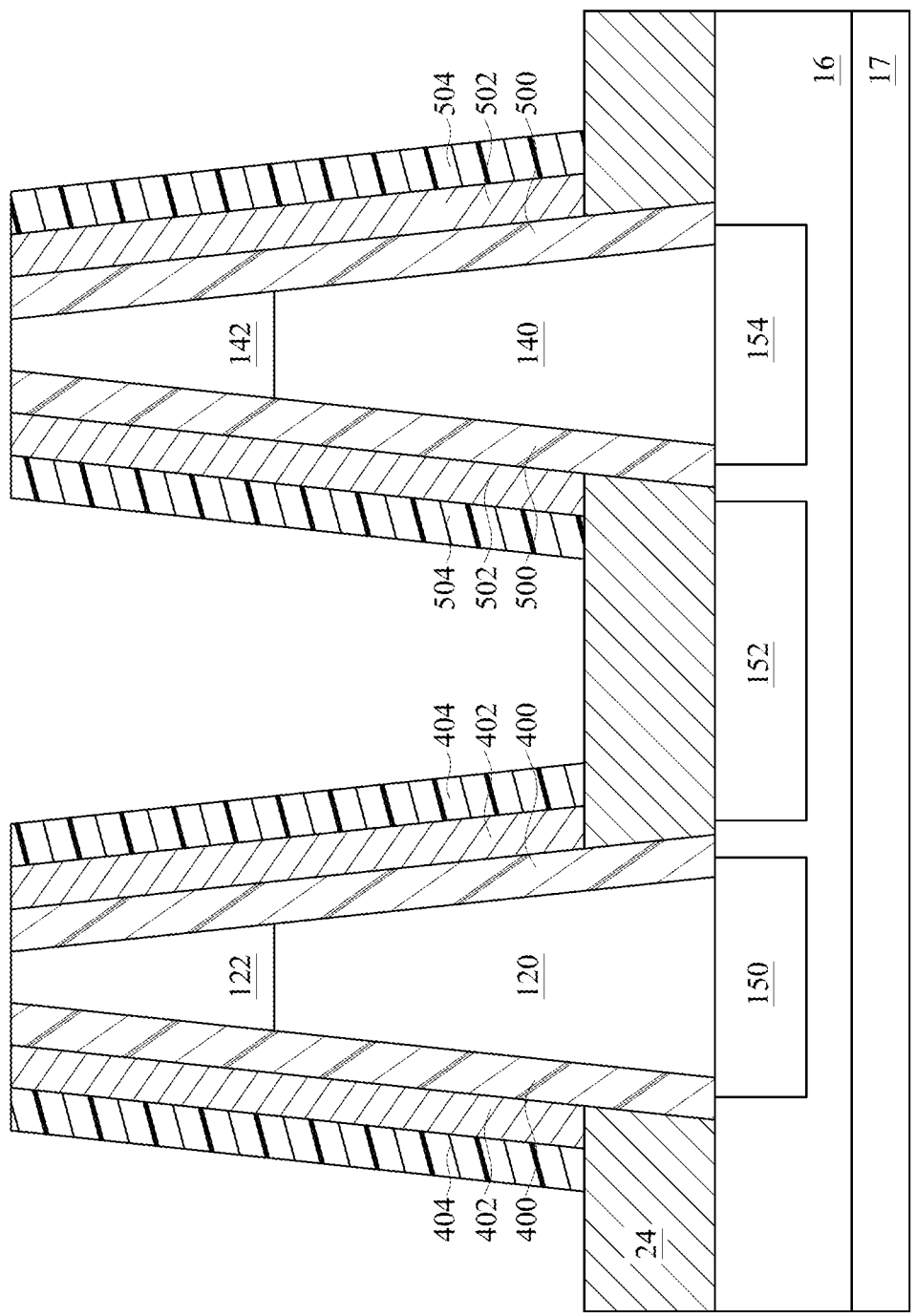

Referring to FIG. 12, sidewall layers 404 and 504, exposing a portion of the semiconductor layer 24, are fully formed on the sidewall layer 402 and the sidewall layer 502, and formed on another portion of the semiconductor layer 24 by performing, for example, an anisotropic etching process or other suitable etching process, on the dielectric layer 44. The sidewall layers 400, 402 and 404 in combination form a first sidewall spacer. The first sidewall spacer includes a nitride-oxide-nitride (N—O—N) structure. Similarly, the sidewall layers 500, 502 and 504 in combination form a second sidewall spacer. The second sidewall spacer includes a nitride-oxide-nitride (N—O—N) structure.

Figure 13:
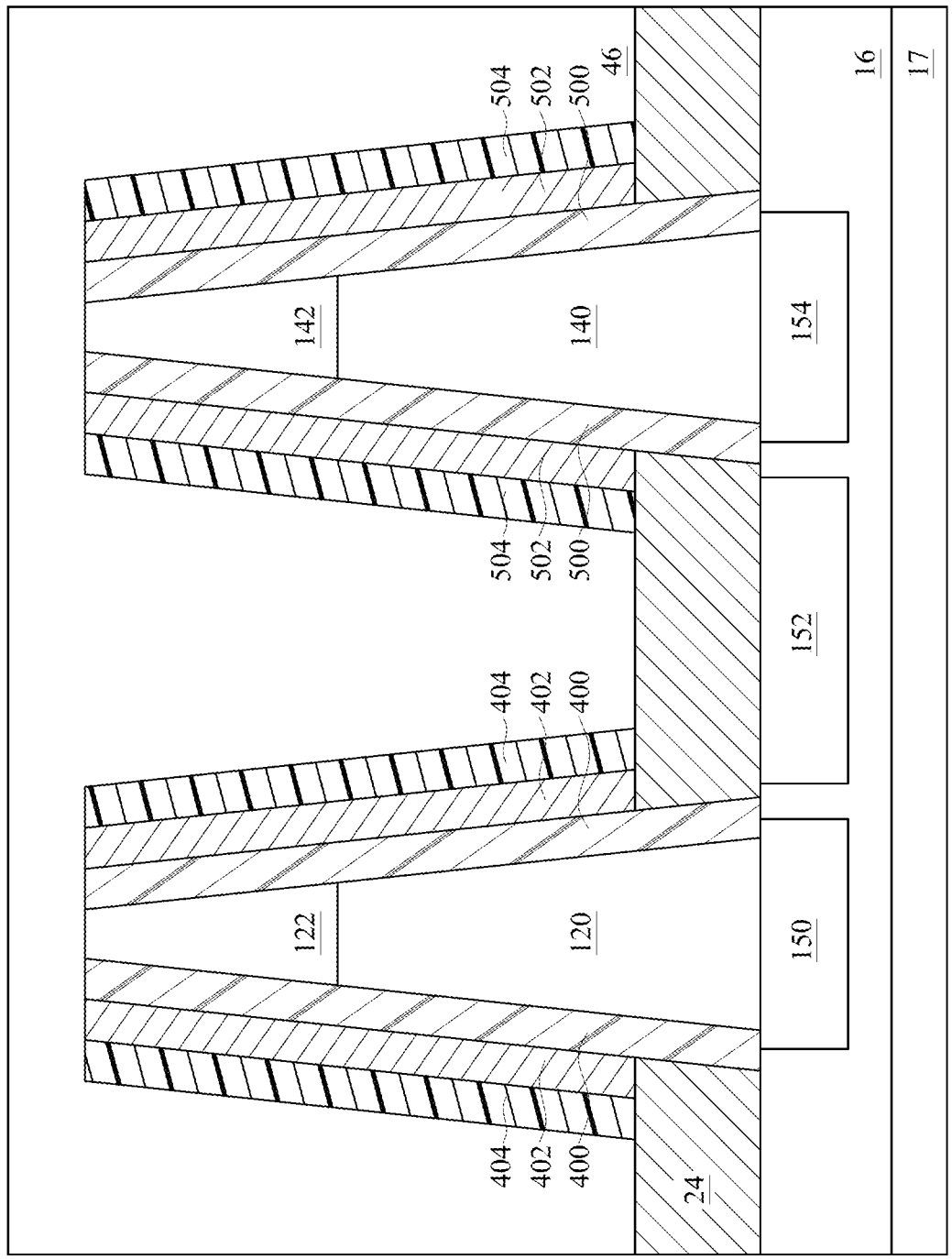

Referring to FIG. 13, a conductive material 46 is formed on the semiconductor layer 24 and on the sidewall layers 400, 402, 500, 502, 404 and 504 by, for example, thermal or chemical vapor deposition in a blanket manner. In some embodiments, the conductive material 46 includes polysilicon.

Figure 14:
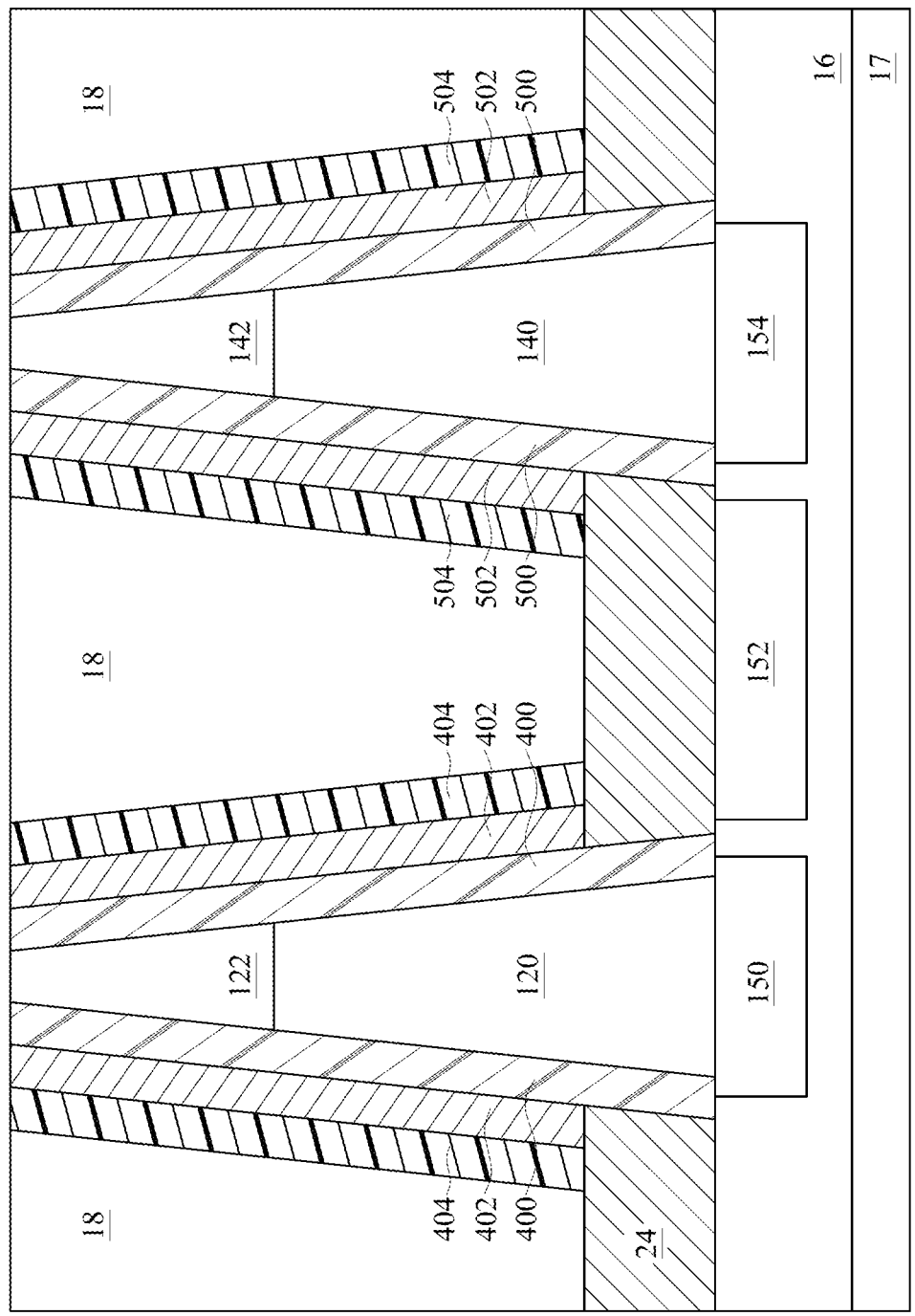

Referring to FIG. 14, a contact 18 configured for routing the active region 152 is formed on the semiconductor layer 24 and the sidewall layers 404 and 504 by performing, for example, an anisotropic etching process, a chemical-mechanical planarization (CMP) process or other suitable etching process, on the conductive material 46.

In the present disclosure, the semiconductor layer 24 is formed to raise a silicon surface, thereby increasing a contact area between the contact 18 and the silicon surface. As a result, a contact resistance between the contact 18 and the silicon surface is relatively low, and therefore performance of the semiconductor device 60 is relatively high.

FIGS. 15 to 20 individually show a semiconductor structure corresponding to one operation stage of forming a semiconductor device 70, in accordance with some embodiments of the present disclosure. It should be understood that FIG. 15 to FIG. 20 have been simplified to better facilitate a clear understanding of various embodiments of the present disclosure.

Embodiments shown in FIGS. 15 to 20 follow the embodiment shown in FIG. 5, in particular, with the sidewall layers 400 and 500 including a silicon nitride.

Figure 15:
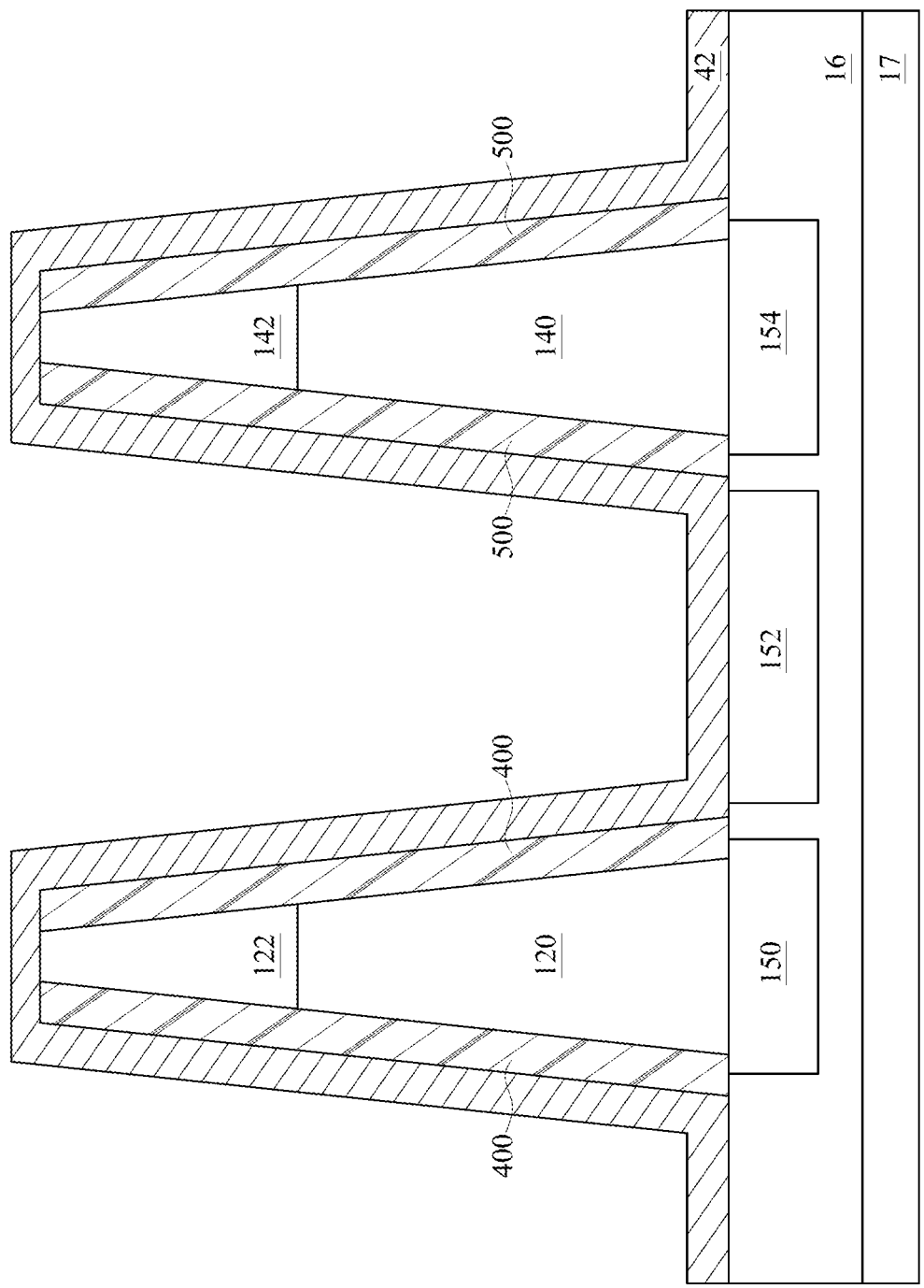
FIGS. 15 to 20 individually show a semiconductor structure corresponding to one operation stage of forming a semiconductor device, in accordance with some embodiments of the present disclosure.

Referring to FIG. 15, a dielectric layer 42 is formed on the semiconductor substrate 17 and the sidewall layers 400 and 500 by, for example, thermal or chemical vapor deposition in a blanket manner. In an embodiment, the dielectric layer 42 includes oxide.

Figure 16:
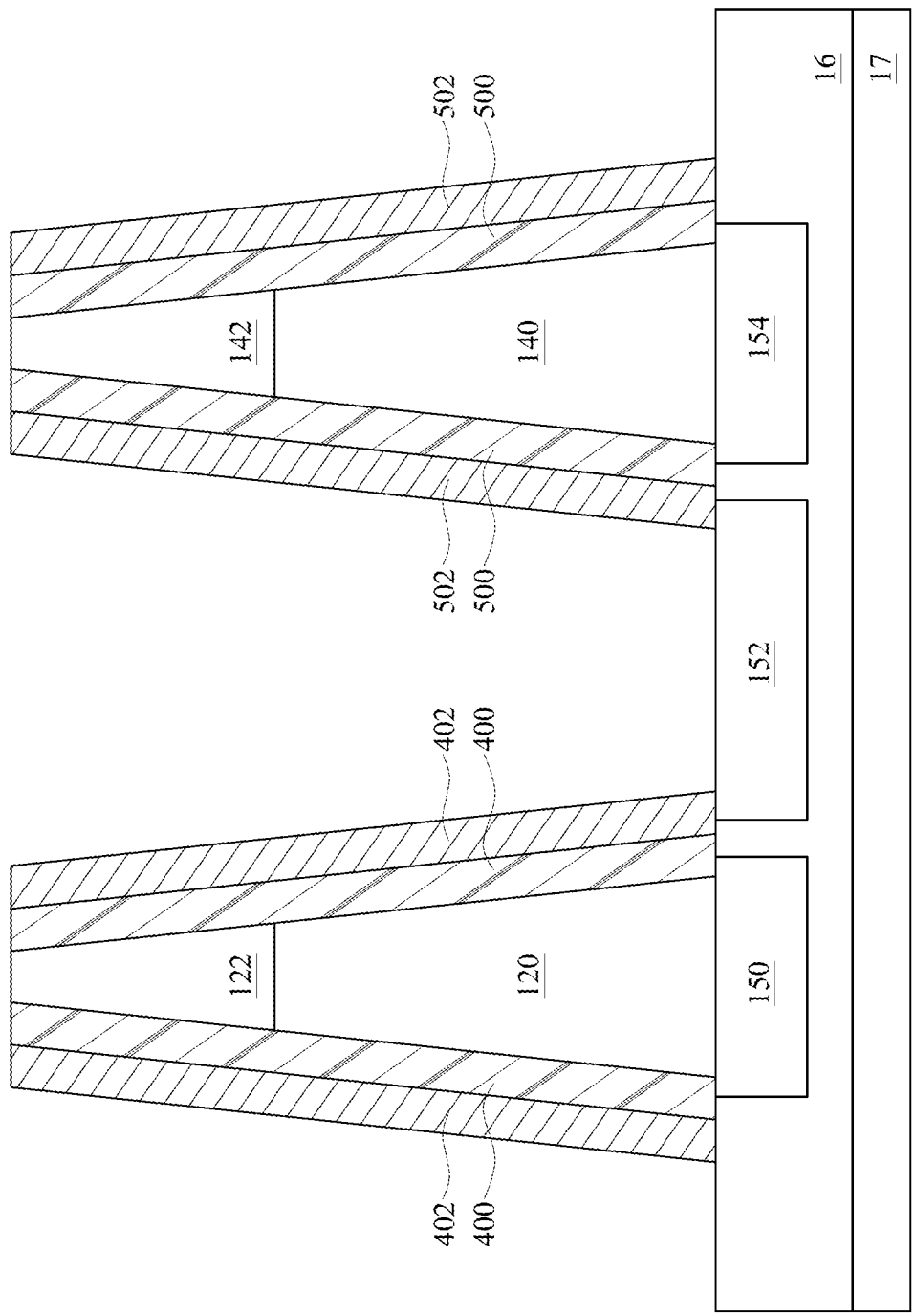

Referring to FIG. 16, sidewall layers 402 and 502, exposing a portion of the semiconductor substrate 17, are fully formed on the sidewall layers 400 and 500, respectively, and on a portion of the semiconductor substrate 17 by performing, for example, an anisotropic etching process or other suitable etching process, on the dielectric layer 42.

Figure 17:
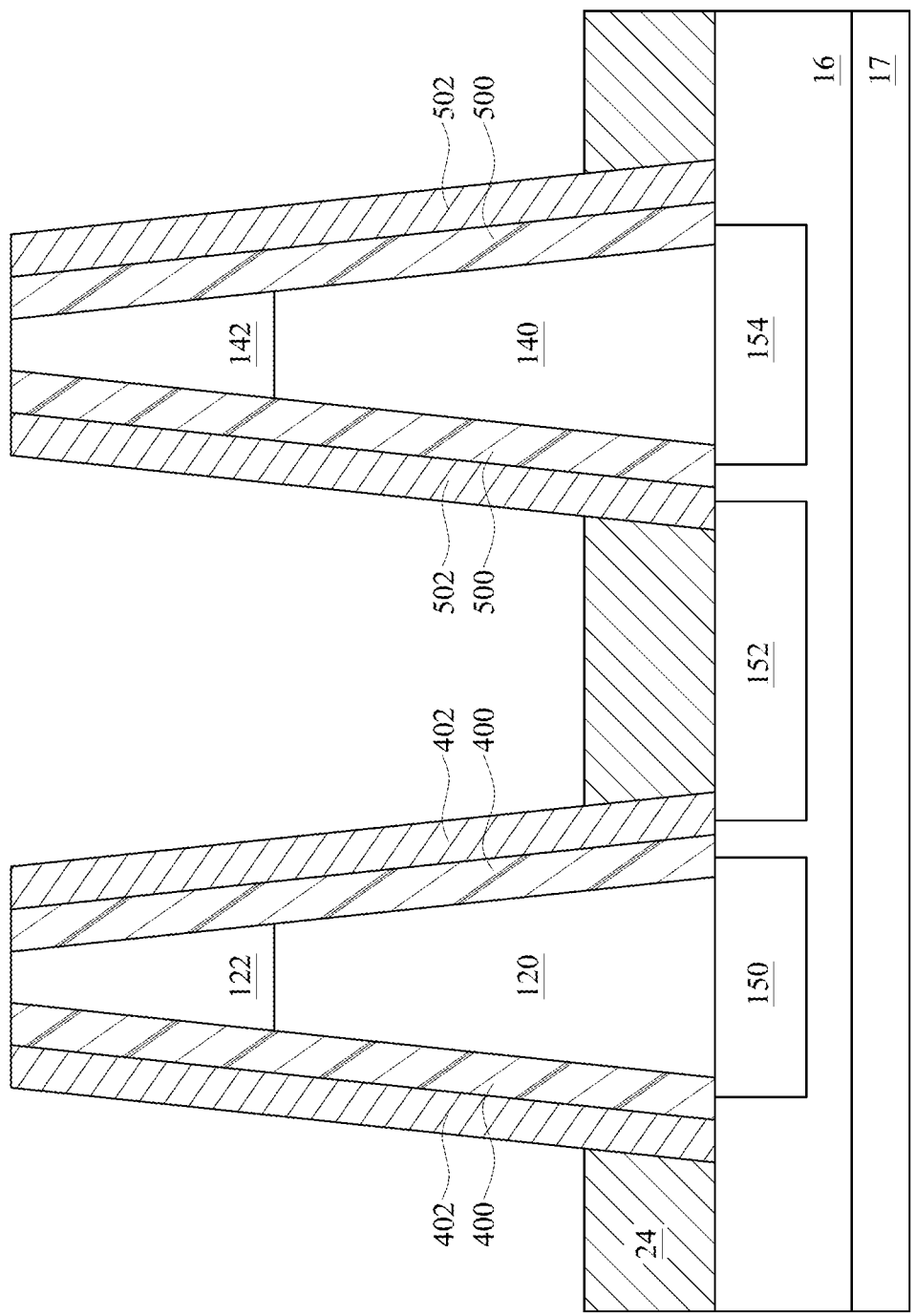

Referring to FIG. 17, a semiconductor layer 24 is formed on the semiconductor substrate 17, and between the sidewall layers 402 and 502 by, for example, an epitaxial deposition process. In such embodiments, the semiconductor layer 24 includes an epitaxial layer. The semiconductor layer 24 is in contact with the sidewall layers 402 and 502. The semiconductor layer 24 has the same impurity, for example, silicon, as the active region 152. Therefore, a silicon surface is accordingly raised.

Figure 18:
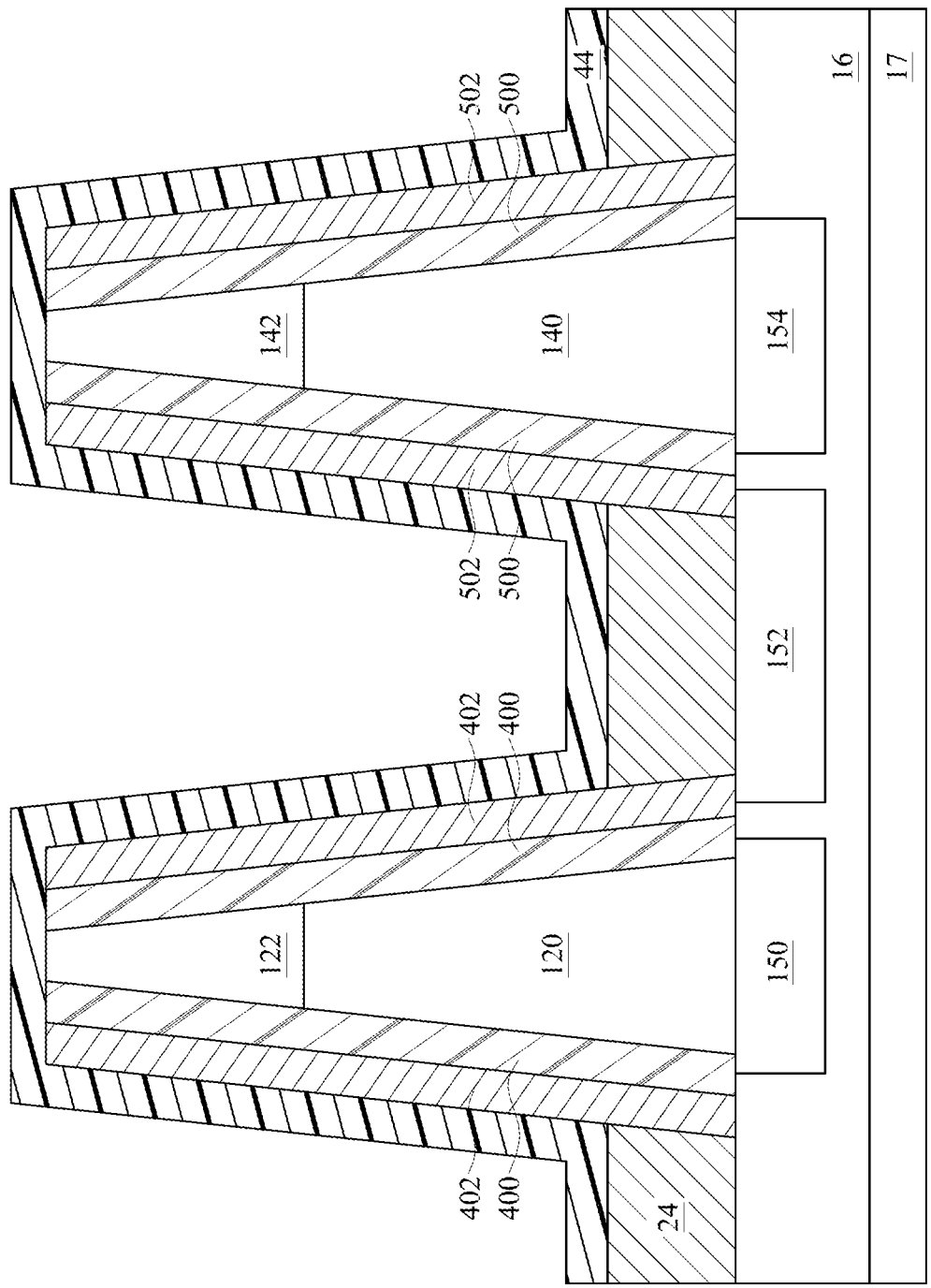

Referring to FIG. 18, a dielectric layer 44 is formed on the semiconductor layer 24, and on the sidewall layers 400, 500, 402 and 502 by, for example, thermal or chemical vapor deposition in a blanket manner. In an embodiment, the dielectric layer 44 includes silicon nitride.

Figure 19:
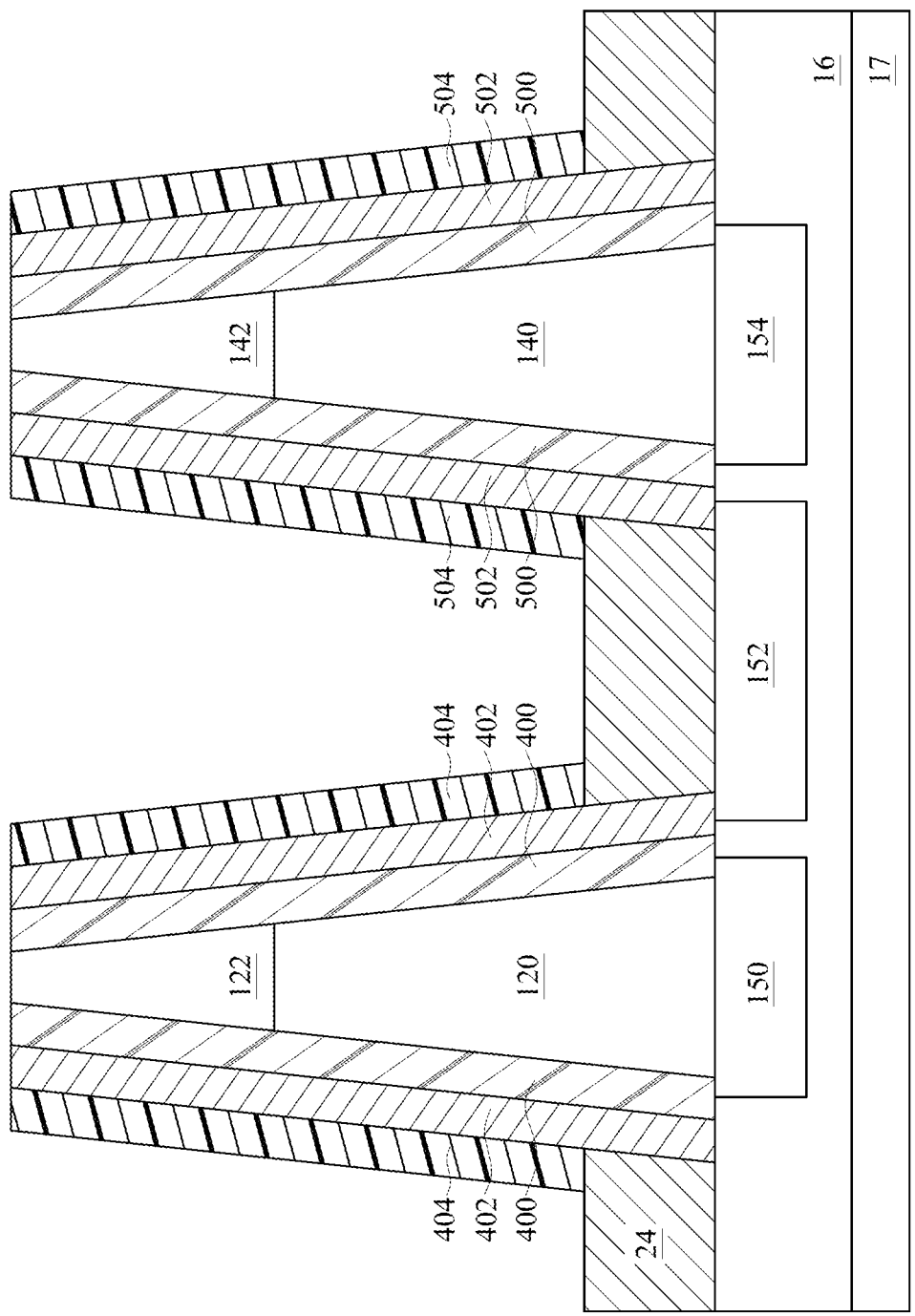

Referring to FIG. 19, sidewall layers 404 and 504, exposing a portion of the semiconductor layer 24, are formed on a portion of the sidewall layer 402, a portion of the sidewall layer 502 and another portion of the semiconductor layer 24 by performing, for example, an isotropic etching process or other suitable etching process, on the dielectric layer 44. The sidewall layers 400, 402 and 404 in combination form a first sidewall spacer. The first sidewall spacer includes a nitride-oxide-nitride (N—O—N) structure. Similarly, the sidewall layers 500, 502 and 504 in combination form a second sidewall spacer. The second sidewall spacer includes a nitride-oxide-nitride (N—O—N) structure.

Figure 20:
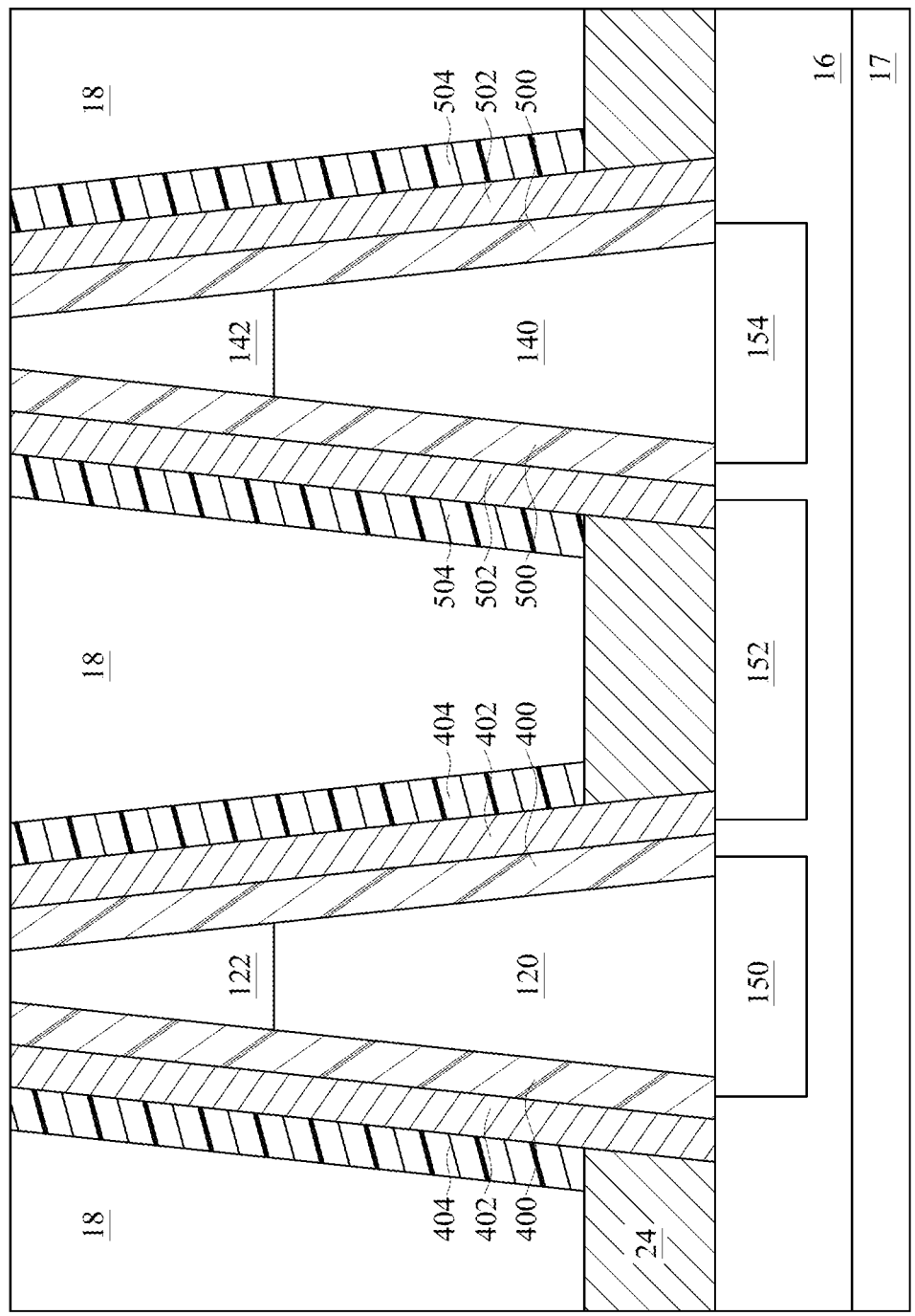

Referring to FIG. 20, a contact 18 configured for routing the active region 152 is formed on the semiconductor layer 24 and the sidewall layers 404 and 504 by performing, for example, an isotropic etching process or other suitable etching process, on the conductive material 46.

Figure 21:
FIG. 21 is a flowchart of a method of forming a semiconductor device, in accordance with some embodiments of the present disclosure.

FIG. 21 is a flowchart of a method 80 of forming a semiconductor device, in accordance with some embodiments of the present disclosure. Referring to FIG. 21, the method 80 includes operations 800, 802, 804, 806, 808, 810 and 812.

The method 80 begins with operation 800, in which a semiconductor substrate is placed.

The method 80 proceeds to operation 802, in which a first bit line structure is formed on the semiconductor substrate.

The method 80 continues with operation 804, in which a second bit line structure is formed on the semiconductor substrate.

The method 80 proceeds to operation 806, in which a first multi-layer spacer is formed on each sidewall of the first bit line structure.

The method 80 continues with operation 808, in which a second multi-layer spacer is formed on each sidewall of the second bit line structure.

The method 80 proceeds to operation 810, in which a semiconductor layer is formed on the semiconductor substrate during the formation of the first multi-layer spacer and during the formation of the second multi-layer spacer.

The method 80 proceeds to operation 812, in which a contact is formed on the semiconductor layer.

The method 80 is merely an example, and is not intended to limit the present disclosure beyond what is explicitly recited in the claims. Additional operations can be provided before, during, and after the method 80, and some operations described can be replaced, eliminated, or moved around for additional embodiments of the method.

In the present disclosure, the semiconductor layer 24 is formed to raise a silicon surface, thereby increasing a contact area between the contact 18 and the silicon surface. As a result, a contact resistance between the contact 18 and the silicon surface is relatively low, and therefore performance of the semiconductor device 70 is relatively high.

One embodiment of the present disclosure provides a semiconductor device. The semiconductor device includes a semiconductor substrate, a semiconductor layer, and a contact. The semiconductor layer is over the semiconductor substrate. The contact has an interface with the semiconductor layer. The contact is substantially tapered toward the semiconductor substrate to the interface.

Another embodiment of the present disclosure provides a semiconductor device. The semiconductor device includes a semiconductor substrate, a semiconductor layer and a contact. The semiconductor layer is over the semiconductor substrate. The contact is disposed on the semiconductor layer. A contact area between the contact and the semiconductor layer is positively correlated to a thickness of the semiconductor layer.

Another aspect of the present disclosure provides a method of forming a semiconductor device. The method includes receiving a semiconductor substrate; forming a first multi-layer spacer on the semiconductor substrate; forming a semiconductor layer on the semiconductor substrate during the formation of the first multi-layer spacer; and forming a contact on the semiconductor layer.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
 a semiconductor substrate;
 a semiconductor layer over the semiconductor substrate; and
 a contact having an interface with the semiconductor layer,
 wherein the contact is substantially tapered toward the semiconductor substrate to the interface;
 wherein the semiconductor layer has an interface with the semiconductor substrate,
 wherein the semiconductor layer is substantially tapered to the interface between the semiconductor layer and the semiconductor substrate.

2. The semiconductor device of claim 1, further comprising:
 a first sidewall spacer; and
 a second sidewall spacer opposed to the first sidewall spacer,
 wherein both the semiconductor layer and the contact are between the first sidewall spacer and the second sidewall spacer.

3. The semiconductor device of claim 1, further comprising:
 a first bit-line structure;

a second bit-line structure;
a first sidewall spacer disposed on each sidewall of the first bit-line structure; and
a second sidewall spacer disposed on each sidewall of the second bit-line structure,
wherein one of the first sidewall spacers is opposed to one of the second sidewall spacers, and
wherein both the semiconductor layer and the contact are between the one of the first sidewall spacers and the one of the second sidewall spacers.

4. The semiconductor device of claim 1, further comprising:
an active region in the semiconductor substrate,
wherein the contact is configured for routing the active region.

5. The semiconductor device of claim 1, wherein the semiconductor layer includes an epitaxial layer.

6. The semiconductor device of claim 1, wherein a thickness of the semiconductor layer ranges from about 1 nm to about 100 nm.

7. The semiconductor device of claim 1, further comprising:
a first structure including:
a first bit-line structure; and
a first sidewall spacer disposed on a sidewall of the first bit-line structure; and
a second structure including:
a second bit-line structure; and
a second sidewall spacer disposed on a sidewall of the second bit-line structure,
wherein both the semiconductor layer and the contact are between the first structure and the second structure, and
wherein a taper direction of the first structure is the same as that of the second structure, and opposed to that of the contact.

8. The semiconductor device of claim 7, wherein the taper direction of the first structure is opposite to that of the semiconductor layer.

9. A semiconductor device, comprising:
a semiconductor substrate;
a first sidewall spacer;
a second sidewall spacer opposed to the first sidewall spacer;
a semiconductor layer over the semiconductor substrate, the semiconductor layer including an upper portion and a lower portion, both of which are disposed between the first sidewall spacer and the second sidewall spacer, the upper portion being disposed on the lower portion, wherein the upper portion is, in a direction in which the first sidewall spacer and the second sidewall spacer are arranged, longer than the lower portion; and
a contact disposed on the semiconductor layer.

10. The semiconductor device of claim 9, wherein the first sidewall spacer includes:
a first sidewall layer disposed on the semiconductor substrate; and
a second sidewall layer disposed on the semiconductor layer.

11. The semiconductor device of claim 10, wherein the second sidewall layer is in contact with the first sidewall layer.

12. The semiconductor device of claim 11, wherein the semiconductor layer is in contact with the first sidewall layer.

13. The semiconductor device of claim 10, wherein the first sidewall spacer includes a nitride-oxide-nitride (N—O—N) structure.

14. The semiconductor device of claim 9, further comprising:
a first structure including:
a first bit-line structure; and
the first sidewall spacer disposed on a sidewall of the first bit-line structure and in contact with the semiconductor layer and the contact,
wherein a taper direction of the first structure is opposed to that of the contact.

15. A method of forming a semiconductor device, the method comprising:
forming a first multi-layer spacer on a semiconductor substrate;
forming a semiconductor layer on the semiconductor substrate during the formation of the first multi-layer spacer; and
forming a contact on the semiconductor layer.

16. The method of claim 15, wherein the formation of the first multi-layer spacer on the semiconductor substrate includes:
forming a first sidewall layer of the first multi-layer spacer on the semiconductor substrate; and
forming a second sidewall layer of the first multi-layer spacer on the semiconductor layer after the formation of the semiconductor layer.

17. The method of claim 15, wherein the formation of the semiconductor layer on the semiconductor substrate during the formation of the first multi-layer spacer includes:
forming the semiconductor layer in contact with the first sidewall layer on the semiconductor substrate.

18. The method of claim 15, further comprising:
forming a first bit-line structure and a second bit-line structure on the semiconductor substrate,
wherein the formation of the first multi-layer spacer includes:
forming a first sidewall layer of the first multi-layer spacer on each sidewall of the first bit-line structure; and
forming a first sidewall layer of a second multi-layer spacer on each sidewall of the second bit-line structure;
wherein the formation of the semiconductor layer includes:
forming the semiconductor layer, in contact with the first sidewall layer of the first multi-layer spacer and the first sidewall layer of the second multi-layer spacer, on the semiconductor substrate,
forming a second sidewall layer of the first multi-layer spacer on each first sidewall layer of the first multi-layer spacer, and on the semiconductor layer; and
forming a second sidewall layer of the second multi-layer spacer on each first sidewall layer of the second multi-layer spacer, and on the semiconductor layer,
wherein the formation of the contact includes:
forming the contact on the semiconductor layer.

19. The method of claim 18, wherein the formation of the first bit-line structure includes:
forming the first bit-line structure, which is substantially tapered toward a direction opposite to the semiconductor substrate.

* * * * *